US012671227B2

(12) United States Patent
Blasczak et al.

(10) Patent No.: US 12,671,227 B2
(45) Date of Patent: Jun. 30, 2026

(54) METHODS AND DEVICES FOR AN ELECTRICALLY EFFICIENT GREEN LASER DIODE DRIVE SYSTEM WITH BOOST SERVO

(71) Applicant: ZEBRA TECHNOLOGIES CORPORATION, Lincolnshire, IL (US)

(72) Inventors: Matthew D. Blasczak, Shirley, NY (US); James R. Giebel, Centerport, NY (US); Mark Weitzner, Plainview, NY (US); Gary G. Schneider, Stony Brook, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 1150 days.

(21) Appl. No.: 17/499,721

(22) Filed: Oct. 12, 2021

(65) Prior Publication Data

US 2023/0111084 A1     Apr. 13, 2023

(51) Int. Cl.
*H01S 5/042* (2006.01)
*H01S 5/00* (2006.01)
*H01S 5/026* (2006.01)

(52) U.S. Cl.
CPC .......... *H01S 5/0261* (2013.01); *H01S 5/0014* (2013.01); *H01S 5/042* (2013.01)

(58) Field of Classification Search
CPC .......................... H01S 5/0427; H01S 5/0428
See application file for complete search history.

(56) References Cited

U.S. PATENT DOCUMENTS

| | | | |
|---|---|---|---|
| 11,934,911 B2 * | 3/2024 | Gurevich | ........... G06K 7/10554 |
| 2003/0058699 A1 | 3/2003 | Hirabayashi | |
| 2009/0316743 A1 | 12/2009 | Alfrey | |
| 2010/0026274 A1 | 2/2010 | Chang et al. | |
| 2013/0009568 A1 | 1/2013 | Yu | |
| 2013/0306734 A1 | 11/2013 | Xian et al. | |
| 2015/0130903 A1 | 5/2015 | Thompson et al. | |

FOREIGN PATENT DOCUMENTS

| | | |
|---|---|---|
| JP | 2006085754 A | 3/2006 |
| KR | 102281878 B1 | 7/2021 |

OTHER PUBLICATIONS

International Search Report and Written Opinion for International Application No. PCT/US2022/046332 mailed on Jan. 6, 2023.

* cited by examiner

*Primary Examiner* — Tod T Van Roy
*Assistant Examiner* — Delma R Forde

(57) ABSTRACT

Methods and devices for driving a laser diode are disclosed herein. An example method includes a boost regulator outputting a maximum boost voltage to drive a laser diode that is configured to output light within a wavelength range of 495 nanometers (nm) to 570 nm. A boost servo may measure a laser voltage, and calculate a voltage difference between the two voltages. The servo may then compare the voltage difference to a drive voltage to determine an excess voltage, and may cause the boost regulator to output an optimum voltage based on the excess voltage. The boost servo may also calculate a low voltage to drive at least one additional component that is electrically coupled to the boost regulator when the laser diode is inactive; and may cause the boost regulator to output the low voltage to power the at least one additional component.

20 Claims, 9 Drawing Sheets

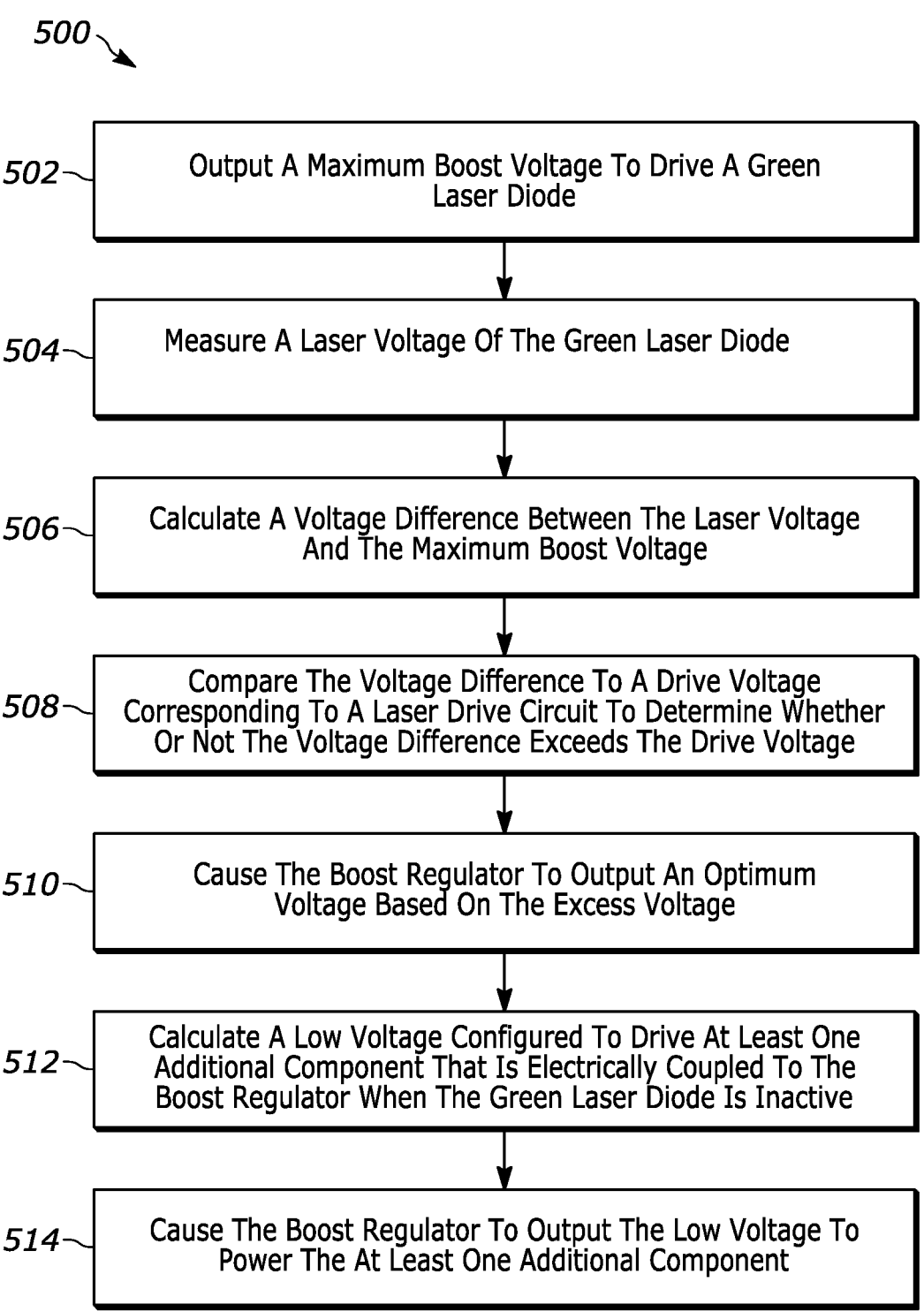

*500*

502 — Output A Maximum Boost Voltage To Drive A Green Laser Diode

504 — Measure A Laser Voltage Of The Green Laser Diode

506 — Calculate A Voltage Difference Between The Laser Voltage And The Maximum Boost Voltage 508 — Compare The Voltage Difference To A Drive Voltage Corresponding To A Laser Drive Circuit To Determine Whether Or Not The Voltage Difference Exceeds The Drive Voltage 510 — Cause The Boost Regulator To Output An Optimum Voltage Based On The Excess Voltage 512 — Calculate A Low Voltage Configured To Drive At Least One Additional Component That Is Electrically Coupled To The Boost Regulator When The Green Laser Diode Is Inactive 514 — Cause The Boost Regulator To Output The Low Voltage To Power The At Least One Additional Component

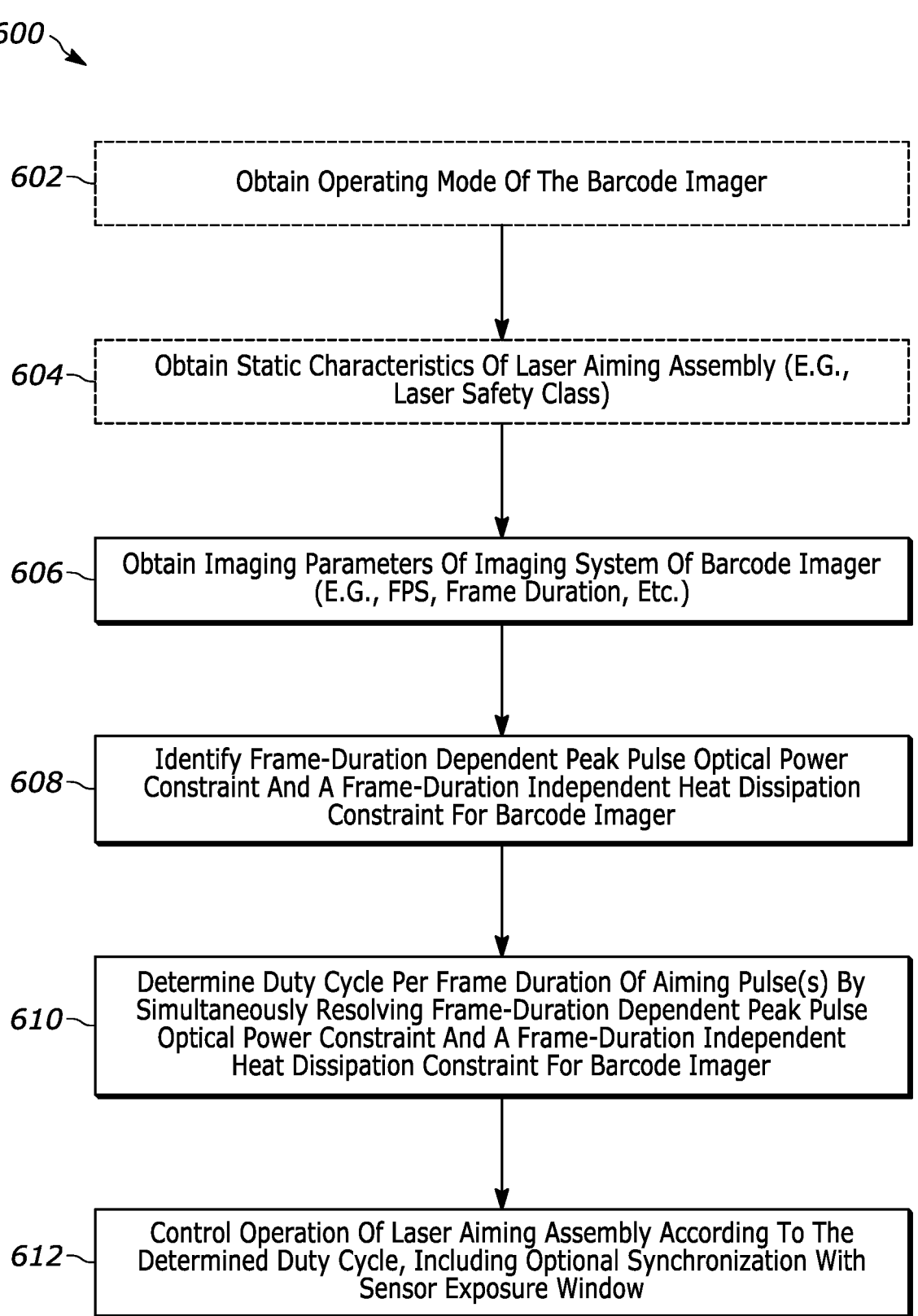

602 — Obtain Operating Mode Of The Barcode Imager

604 — Obtain Static Characteristics Of Laser Aiming Assembly (E.G., Laser Safety Class)

606 — Obtain Imaging Parameters Of Imaging System Of Barcode Imager (E.G., FPS, Frame Duration, Etc.)

608 — Identify Frame-Duration Dependent Peak Pulse Optical Power Constraint And A Frame-Duration Independent Heat Dissipation Constraint For Barcode Imager 610 — Determine Duty Cycle Per Frame Duration Of Aiming Pulse(s) By Simultaneously Resolving Frame-Duration Dependent Peak Pulse Optical Power Constraint And A Frame-Duration Independent Heat Dissipation Constraint For Barcode Imager 612 — Control Operation Of Laser Aiming Assembly According To The Determined Duty Cycle, Including Optional Synchronization With Sensor Exposure Window

FIG. 6

METHODS AND DEVICES FOR AN ELECTRICALLY EFFICIENT GREEN LASER DIODE DRIVE SYSTEM WITH BOOST SERVO

BACKGROUND

Cordless devices dependent upon complementary metal-oxide-semiconductor (CMOS) laser driver integrated circuits (IC) have risen to prominence in recent decades. These devices conventionally suffer from a lack of laser variability due to limited power supply capacity. Namely, conventional laser drivers on ICs are insufficient to drive green lasers, thereby necessitating an additional, higher voltage power supply. Boost circuits are typically included to supply the additional power requirements at a fixed boost voltage, but such circuits are inefficient once the temperature of the laser changes. As a result, conventional laser driver circuits are highly inefficient during the working lifetime of a laser, and waste significant amounts of power that is invariably converted into heat causing further stress to the laser driver circuit.

Accordingly, there is a need for systems and methods for an electrically efficient green laser diode drive system with a boost servo.

SUMMARY

In one embodiment, the present invention is a method for driving a laser diode. The method comprises: outputting, by a boost regulator, a maximum boost voltage to drive a laser diode, wherein the laser diode is configured to output light within a wavelength range of 495 nanometers (nm) to 570 nm; measuring, by a boost servo, a laser voltage of the laser diode; calculating, by the boost servo, a voltage difference between the laser voltage and the maximum boost voltage; comparing, by the boost servo, the voltage difference to a drive voltage corresponding to a laser drive circuit to determine whether or not the voltage difference exceeds the drive voltage; responsive to determining that the voltage difference exceeds the drive voltage by an excess voltage, causing, by the boost servo, the boost regulator to output an optimum voltage based on the excess voltage; calculating, by the boost servo, a low voltage configured to drive at least one additional component that is electrically coupled to the boost regulator when the laser diode is inactive; and responsive to the laser diode being inactive, causing, by the boost servo, the boost regulator to output the low voltage to power the at least one additional component.

In a variation of this embodiment, the wavelength range is 510 nm to 525 nm.

In another variation of this embodiment, the at least one additional component is an illumination light emitting diode (LED) or a drive circuit.

In yet another variation of this embodiment, the laser voltage is a first laser voltage, the optimum voltage is a first optimum voltage, the voltage difference is a first voltage difference, the excess voltage is a first excess voltage, and the method further comprises: measuring, by the boost servo, a second laser voltage of the laser diode and the first optimum boost voltage; calculating, by the boost servo, a second voltage difference between the second laser voltage and the first optimum boost voltage; comparing, by the boost servo, the second voltage difference to the drive voltage to determine whether or not the second voltage difference exceeds the drive voltage; and responsive to determining that the second voltage difference exceeds the drive voltage by a second excess voltage, causing, by the boost servo, the boost regulator to output a second optimum voltage based on the second excess voltage.

In still another variation of this embodiment, the method further comprises: measuring, by the boost servo, a laser current sense voltage; and calculating, by the boost servo, the voltage difference by subtracting the laser voltage and the laser current sense voltage from the maximum boost voltage.

In yet another variation of this embodiment, the method further comprises: determining, by the boost servo, whether or not the laser diode has been inactive for greater than a timeout interval; responsive to determining that the laser diode has been inactive for less than the timeout interval, causing, by the boost servo, the boost regulator to output the optimum voltage to drive the laser diode; and responsive to determining that the laser diode has been inactive for greater than the timeout interval, causing, by the boost servo, the boost regulator to output the maximum boost voltage to drive the laser diode.

In still another variation of this embodiment, the method further comprises: determining, by the boost servo, that the laser diode has been active for greater than an activity duration threshold; responsive to determining that the laser diode has been active for greater than the activity duration threshold, measuring, by the boost servo, the laser voltage at an anode of the laser diode; and calculating, by the boost servo, the voltage difference between the laser voltage at the anode of the laser diode and the optimum voltage.

In yet another variation of this embodiment, the method further comprises: obtaining, by the boost servo, a laser temperature using a temperature sensor; obtaining, by the boost servo, a lookup optimum voltage from a temperature reference table based on the laser temperature; and comparing, by the boost servo, the optimum voltage to the lookup optimum voltage to determine a change to the optimum voltage.

In another embodiment, the present invention is an imaging engine utilizing a laser diode. The imaging engine comprises: an imaging assembly; an image processing assembly for decoding indicia; and an aiming pattern assembly that includes a laser drive subassembly. The laser drive subassembly comprises: a laser diode configured to output light within a wavelength range of 495 nanometers (nm) to 570 nm, a boost regulator configured to output a maximum boost voltage to drive the laser diode, and a boost servo, configured to be electrically coupled with the laser diode and the boost regulator, wherein the boost servo is further configured to: measure a laser voltage of the laser diode, calculate a voltage difference between the laser voltage and the maximum boost voltage, compare the voltage difference to a drive voltage corresponding to a laser drive circuit to determine whether or not the voltage difference exceeds the drive voltage, responsive to determining that the voltage difference exceeds the drive voltage by an excess voltage, cause the boost regulator to output an optimum voltage based on the excess voltage, calculate a low voltage configured to drive at least one additional component that is electrically coupled to the boost regulator when the laser diode is inactive, and responsive to the laser diode being inactive, cause the boost regulator to output the low voltage to power the at least one additional component.

In a variation of this embodiment, the at least one additional component is an illumination light emitting diode (LED) or a drive circuit.

In another variation of this embodiment, the laser voltage is a first laser voltage, the optimum voltage is a first optimum voltage, the voltage difference is a first voltage difference, the excess voltage is a first excess voltage, and the boost servo is further configured to: measure a second laser voltage of the laser diode and the first optimum boost voltage; calculate a second voltage difference between the second laser voltage and the first optimum boost voltage; compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

In yet another variation of this embodiment, the laser drive subassembly further comprises a laser current sense module, and wherein the boost servo is further configured to: measure a laser current sense voltage across the laser current sense module; and calculate the voltage difference by subtracting the laser voltage and the laser current sense voltage from the maximum boost voltage.

In still another variation of this embodiment, the boost servo is further configured to: determine whether or not the laser diode has been inactive for greater than a timeout interval; responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

In yet another variation of this embodiment, the laser drive subassembly further comprises a temperature sensor configured to measure a laser temperature, and a temperature reference table including lookup optimum voltages, and wherein the boost servo is further configured to: obtain the laser temperature using the temperature sensor; obtain a respective lookup optimum voltage from the temperature reference table based on the laser temperature; and compare the optimum voltage to the respective lookup optimum voltage to determine a change to the optimum voltage.

In still another variation of this embodiment, the boost servo is further configured to: determine that the laser diode has been active for greater than an activity duration threshold; responsive to determining that the laser diode has been active for greater than the activity duration threshold, measure the laser voltage at an anode of the laser diode; and calculate the voltage difference between the laser voltage at the anode of the laser diode and the optimum voltage.

In yet another embodiment, the present invention is a tangible machine-readable medium comprising instructions that, when executed, cause a machine to at least: measure a laser voltage of a laser diode, wherein the laser diode is configured to output light within a wavelength range of 495 nanometers (nm) to 570 nm; calculate a voltage difference between the laser voltage a and a maximum boost voltage supplied to drive the laser diode; compare the voltage difference to a drive voltage corresponding to a laser drive circuit to determine whether or not the voltage difference exceeds the drive voltage; responsive to determining that the voltage difference exceeds the drive voltage by an excess voltage, cause a boost regulator to output an optimum voltage based on the excess voltage; calculate a low voltage configured to drive at least one additional component that is electrically coupled to the boost regulator when the laser diode is inactive; and responsive to the laser diode being inactive, cause the boost regulator to output the low voltage to power the at least one additional component.

In a variation of this embodiment, the at least one additional component is an illumination light emitting diode (LED) or a drive circuit.

In another variation of this embodiment, the laser voltage is a first laser voltage, the optimum voltage is a first optimum voltage, the voltage difference is a first voltage difference, the excess voltage is a first excess voltage, and the instructions, when executed, further cause the machine to at least: measure a second laser voltage of the laser diode and the first optimum boost voltage; calculate a second voltage difference between the second laser voltage and the first optimum boost voltage; compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

In yet another variation of this embodiment, the instructions, when executed, further cause the machine to at least: measure a laser current sense voltage across a laser current sense module; and calculate the voltage difference by subtracting the laser voltage and the laser current sense voltage from the maximum boost voltage.

In still another variation of this embodiment, the instructions, when executed, further cause the machine to at least: determine whether or not the laser diode has been inactive for greater than a timeout interval; responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

In still another embodiment, the present invention is a method for driving a laser diode. The method comprises: outputting, by a boost regulator, a maximum boost voltage to drive a laser diode; measuring, by a boost servo, a laser voltage of the laser diode; calculating, by the boost servo, a voltage difference between the laser voltage and the maximum boost voltage; determining, by the boost servo, whether or not a drive voltage corresponding to a laser drive circuit satisfies a drive voltage threshold by monitoring an optical power control loop that is configured to regulate the drive voltage; responsive to determining that the drive voltage satisfies the drive voltage threshold, comparing, by the boost servo, the voltage difference to the drive voltage to determine whether or not the voltage difference exceeds the drive voltage; and responsive to determining that the voltage difference exceeds the drive voltage by an excess voltage, causing, by the boost servo, the boost regulator to output an optimum voltage based on the excess voltage.

In a variation of this embodiment, the boost servo monitors the optical power control loop at a monitoring frequency to determine whether or not the drive voltage satisfies the drive voltage threshold.

In another variation of this embodiment, the method comprises: calculating, by the boost servo, a low voltage configured to drive at least one additional component that is electrically coupled to the boost regulator when the laser diode is inactive; and responsive to the laser diode being inactive, causing, by the boost servo, the boost regulator to output the low voltage to power the at least one additional component.

In yet another variation of this embodiment, the at least one additional component is an illumination light emitting diode (LED) or a drive circuit.

In still another variation of this embodiment, the laser voltage is a first laser voltage, the optimum voltage is a first optimum voltage, the voltage difference is a first voltage difference, the excess voltage is a first excess voltage, and the method further comprises: measuring, by the boost servo, a second laser voltage of the laser diode and the first optimum boost voltage; calculating, by the boost servo, a second voltage difference between the second laser voltage and the first optimum boost voltage; comparing, by the boost servo, the second voltage difference to the drive voltage to determine whether or not the second voltage difference exceeds the drive voltage; and responsive to determining that the second voltage difference exceeds the drive voltage by a second excess voltage, causing, by the boost servo, the boost regulator to output a second optimum voltage based on the second excess voltage.

In yet another variation of this embodiment, the method further comprises: measuring, by the boost servo, a laser current sense voltage; and calculating, by the boost servo, the voltage difference by subtracting the laser voltage and the laser current sense voltage from the maximum boost voltage.

In still another variation of this embodiment, the method further comprises: determining, by the boost servo, whether or not the laser diode has been inactive for greater than a timeout interval; responsive to determining that the laser diode has been inactive for less than the timeout interval, causing, by the boost servo, the boost regulator to output the optimum voltage to drive the laser diode; and responsive to determining that the laser diode has been inactive for greater than the timeout interval, causing, by the boost servo, the boost regulator to output the maximum boost voltage to drive the laser diode.

In yet another variation of this embodiment, the method further comprises: determining, by the boost servo, that the laser diode has been active for greater than an activity duration threshold; responsive to determining that the laser diode has been active for greater than the activity duration threshold, measuring, by the boost servo, the laser voltage at an anode of the laser diode; and calculating, by the boost servo, the voltage difference between the laser voltage at the anode of the laser diode and the optimum voltage.

In yet another embodiment, the present invention is an imaging engine utilizing a laser diode. The imaging engine comprises: an imaging assembly; an image processing assembly for decoding indicia; and an aiming pattern assembly that includes a laser drive subassembly comprising: a laser diode, an optical power control loop configured to regulate a drive voltage corresponding to a laser drive circuit, a boost regulator configured to output a maximum boost voltage to drive the laser diode, and a boost servo, configured to be electrically coupled with the laser diode and the boost regulator, wherein the boost servo is further configured to: measure a laser voltage of the laser diode, calculate a voltage difference between the laser voltage and the maximum boost voltage, determine whether or not the drive voltage satisfies a drive voltage threshold by monitoring the optical power control loop, responsive to determining that the drive voltage satisfies the drive voltage threshold, compare the voltage difference to the drive voltage to determine whether or not the voltage difference exceeds the drive voltage, and responsive to determining that the voltage difference exceeds the drive voltage by an excess voltage, cause the boost regulator to output an optimum voltage based on the excess voltage.

In a variation of this embodiment, the laser diode is configured to output light within a wavelength range of 495 nanometers (nm) to 570 nm.

In another variation of this embodiment, the laser voltage is a first laser voltage, the optimum voltage is a first optimum voltage, the voltage difference is a first voltage difference, the excess voltage is a first excess voltage, and the boost servo is further configured to: measure a second laser voltage of the laser diode and the first optimum boost voltage; calculate a second voltage difference between the second laser voltage and the first optimum boost voltage; compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

In yet another variation of this embodiment, the laser drive subassembly further comprises a laser current sense module, and wherein the boost servo is further configured to: measure a laser current sense voltage across the laser current sense module; and calculate the voltage difference by subtracting the laser voltage and the laser current sense voltage from the maximum boost voltage.

In still another variation of this embodiment, the boost servo is further configured to: determine whether or not the laser diode has been inactive for greater than a timeout interval; responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

In yet another variation of this embodiment, the laser drive subassembly further comprises a temperature sensor configured to measure a laser temperature, and a temperature reference table including lookup optimum voltages, and wherein the boost servo is further configured to: obtain the laser temperature using the temperature sensor; obtain a respective lookup optimum voltage from the temperature reference table based on the laser temperature; and compare the optimum voltage to the respective lookup optimum voltage to determine a change to the optimum voltage.

In still another variation of this embodiment, the boost servo is further configured to: determine that the laser diode has been active for greater than an activity duration threshold; responsive to determining that the laser diode has been active for greater than the activity duration threshold, measure the laser voltage at an anode of the laser diode; and calculate the voltage difference between the laser voltage at the anode of the laser diode and the optimum voltage.

In yet another embodiment, the present invention is a tangible machine-readable medium comprising instructions that, when executed, cause a machine to at least: measure a laser voltage of a laser diode; calculate a voltage difference between the laser voltage and a maximum boost voltage supplied to drive the laser diode; determine whether or not a drive voltage corresponding to a laser drive circuit satisfies a drive voltage threshold by monitoring an optical power control loop configured to regulate the drive voltage; responsive to determining that the drive voltage satisfies the drive voltage threshold, compare the voltage difference to the drive voltage to determine whether or not the voltage difference exceeds the drive voltage; and responsive to determining that the voltage difference exceeds the drive voltage by an excess voltage, cause a boost regulator to output an optimum voltage based on the excess voltage.

In a variation of this embodiment, the instructions, when executed, further cause the machine to at least: calculate a low voltage configured to drive at least one additional component that is electrically coupled to the boost regulator when the laser diode is inactive; and responsive to the laser diode being inactive, cause the boost regulator to output the low voltage to power the at least one additional component, wherein the at least one additional component is an illumination light emitting diode (LED) or a drive circuit.

In another variation of this embodiment, the laser voltage is a first laser voltage, the optimum voltage is a first optimum voltage, the voltage difference is a first voltage difference, the excess voltage is a first excess voltage, and the instructions, when executed, further cause the machine to at least: measure a second laser voltage of the laser diode and the first optimum boost voltage; calculate a second voltage difference between the second laser voltage and the first optimum boost voltage; compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

In yet another variation of this embodiment, the instructions, when executed, further cause the machine to at least: measure a laser current sense voltage across a laser current sense module; and calculate the voltage difference by subtracting the laser voltage and the laser current sense voltage from the maximum boost voltage.

In still another variation of this embodiment, the instructions, when executed, further cause the machine to at least: determine whether or not the laser diode has been inactive for greater than a timeout interval; responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

In still another embodiment, the present invention is a method for driving a laser diode. The method comprises: outputting, by a boost regulator, a maximum boost voltage to drive a laser diode, wherein the laser diode is configured to output light within a wavelength range of 495 nanometers (nm) to 570 nm; measuring, by a boost servo, a laser voltage of the laser diode and the maximum boost voltage; calculating, by the boost servo, a voltage difference between the laser voltage and the maximum boost voltage; comparing, by the boost servo, the voltage difference to a drive voltage corresponding to a laser drive circuit to determine whether or not the voltage difference exceeds the drive voltage; and responsive to determining that the voltage difference exceeds the drive voltage by an excess voltage, causing, by the boost servo, the boost regulator to output an optimum voltage based on the excess voltage.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 5 illustrates an example method for driving a green laser diode, in accordance with various embodiments of the present invention.

FIG. 6 illustrates a method for driving an aiming assembly of a scanning device, in accordance with various embodiments of the present invention.

Figure 1:
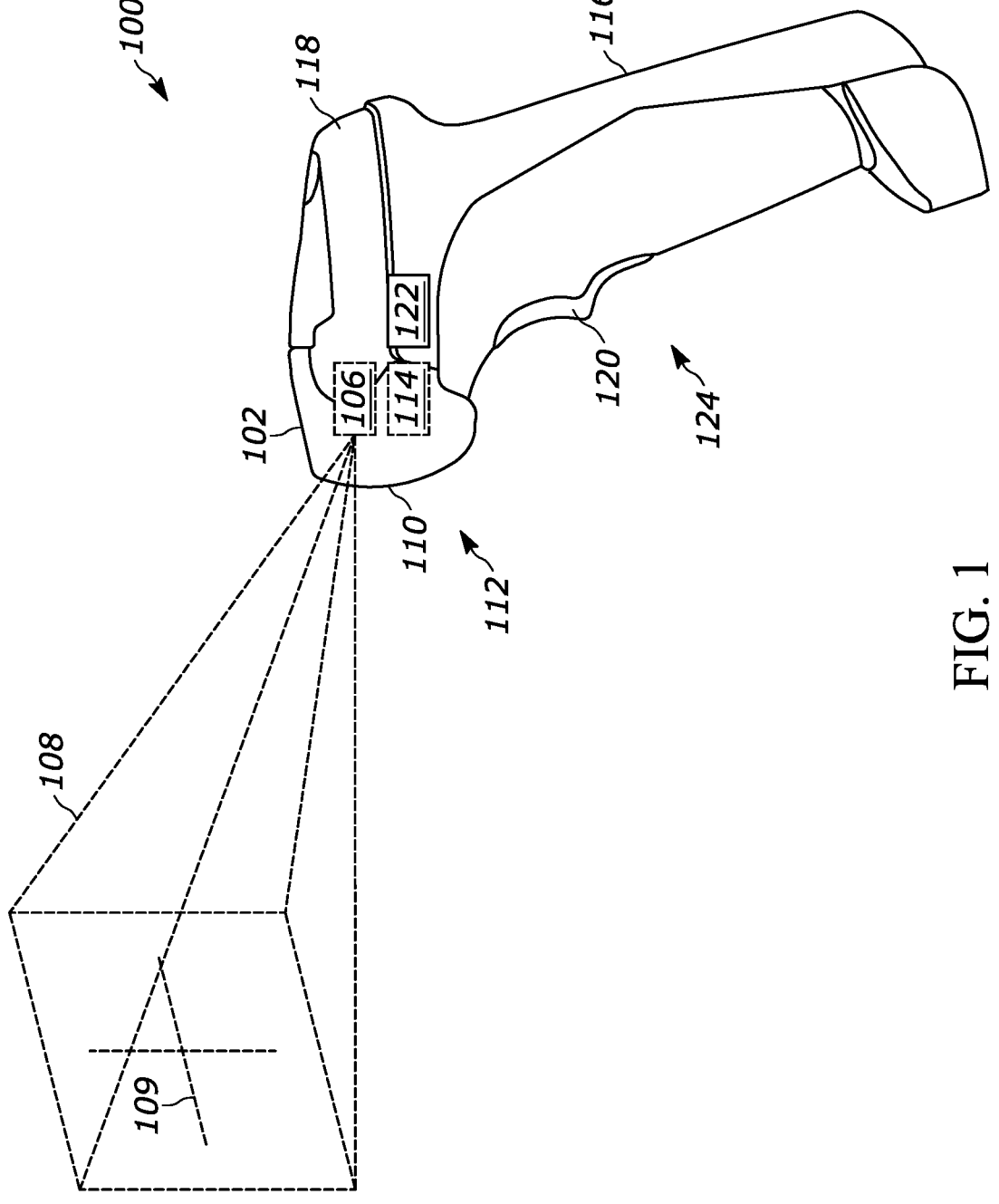
FIG. 1 is a perspective view of an example scanning device, in accordance with various embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Generally speaking, users of cordless (e.g., battery powered) electronics devices desire that the devices apply power efficiently to maximize device uptime/lifetime and to reduce corresponding costs due to excess power consumption and device maintenance and/or replacement. Many conventional cordless electronic devices include green laser diodes that are difficult, if not impossible, for IC laser drivers to power without the addition of a high voltage power supply. However, these traditional power supplies apply a fixed voltage intended to drive the green laser diode, and therefore are unable to efficiently apply different optimum voltages as the temperature of the laser changes.

The methods/systems of the present disclosure provide solutions to this power inefficiency problem associated with traditional power supplies. Namely, the methods/systems of the present disclosure alleviate these inefficient power loss (e.g., heat dissipation) problems associated with traditional power supplies by introducing a boost servo algorithm configured to determine an optimum boost voltage for driving a green laser diode. The boost voltage may be raised or lowered, as needed, to compensate for the forward voltage requirements across the green laser diode that vary as a function of temperature. In this manner, a designer for such green laser diode systems may not be required to choose one fixed boost voltage to work across all operating temperatures, thereby increasing the power consumption efficiency of the system. Moreover, these power consumption efficiencies are further expressed when the green laser diode is pulsed (e.g., less than 100% duty cycle), where the boost voltage may be even further lowered to compensate for the inactive periods of the laser. As a result, the methods/systems of the present disclosure maximize device uptime/lifetime and increase overall power consumption efficiency by intelligently and actively adjusting the forward voltage supplied to the green laser diode to adjust for the temperature variations that occur during laser operation, thereby reducing excess power dissipation in the form of heat. As referenced herein, "green" laser light may refer to light emitted with a wavelength within a range between approximately 495 nanometers (nm) to 570 nm. More specifically, the laser diodes described herein may be configured to output light within a wavelength range of 510 nm to 525 nm.

Referring now to the drawings, FIG. 1 is a perspective view 100 of an example scanning device 100, in accordance with various embodiments of the present invention. The example scanning device 100 includes an example housing 102 in which an image sensor 106 is disposed. The image sensor 106 captures image data representing a target in a field of view 108 at least partially defined by a front-facing opening or window 110 (also referenced herein as an "optical window") on a front side 112 of the example scanning device 100. The example scanning device 100 includes an indicia decoder 114 in communication with the image sensor 106, and configured to receive the image data and decode an indicia captured in the image data.

The example housing 102 of FIG. 1 includes a generally elongated handle or lower handgrip portion 116, and an upper body portion 118 having the front side 112 at which the front-facing opening or window 110 is located. The cross-sectional dimensions and overall size of the handgrip portion 116 are such that the example scanning device 100 can be conveniently held in an operator's hand during operation. The front-facing opening or window 110 is configured to face generally away from a user when the user has the example scanning device 100 in a handheld position. The portions 116 and 118 may be constructed of a lightweight, resilient, shock-resistant, self-supporting material, such as a synthetic plastic material. The housing 102 may be injection molded, but can also be vacuum-formed or blow-molded to form a thin hollow shell which bounds an interior space whose volume is sufficient to contain the various components of the handheld scanner 100. Although the housing 102 is illustrated as a portable, point-of-transaction, gun-shaped, handheld housing, any other configuration including a hands-free configuration could be used.

A manually actuatable trigger 120 is mounted in a moving relationship on the handgrip portion 116 in a forward facing region 124 of the handgrip portion 116. An operator's finger can be used to actuate (e.g., depress) the trigger 120 once a target falls within the imaging field of view 108 to cause the image sensor 106 to capture an image of the target. As a result of actuating the trigger 120, the example scanning device 100 may generate an aiming pattern 109 using the aiming pattern assembly 122. The aiming pattern 109 may visually indicate the field of view 108 of the example scanning device 100 for the operator utilizing the device 100, and may more specifically indicate a region within the field of view 108 where the device 100 may successfully scan and/or otherwise interpret an indicia within the field of view 108.

The aiming pattern assembly 122 may include a green laser diode (not shown) configured to output green laser light in response to receiving a forward voltage as a result of the operator actuating the trigger 120. As discussed further herein, the aiming pattern assembly 122 may also include a boost servo (not shown) that actively adjusts the boost voltage supplied to the green laser diode in order to maximize the power consumption efficiency of the example scanning device 100.

In any event, once the aiming pattern assembly 122 has generated the aiming pattern 109, the operator may then adjust the orientation of the example scanning device 100 until the aiming pattern 109 is centered over an indicia included as part of the target. The example scanning device 100 may then capture image data of the target using the image sensor 106, and thereafter proceed to decode any indicia included within the image by applying the indicia decoder 114 to the image data.

Figure 2:
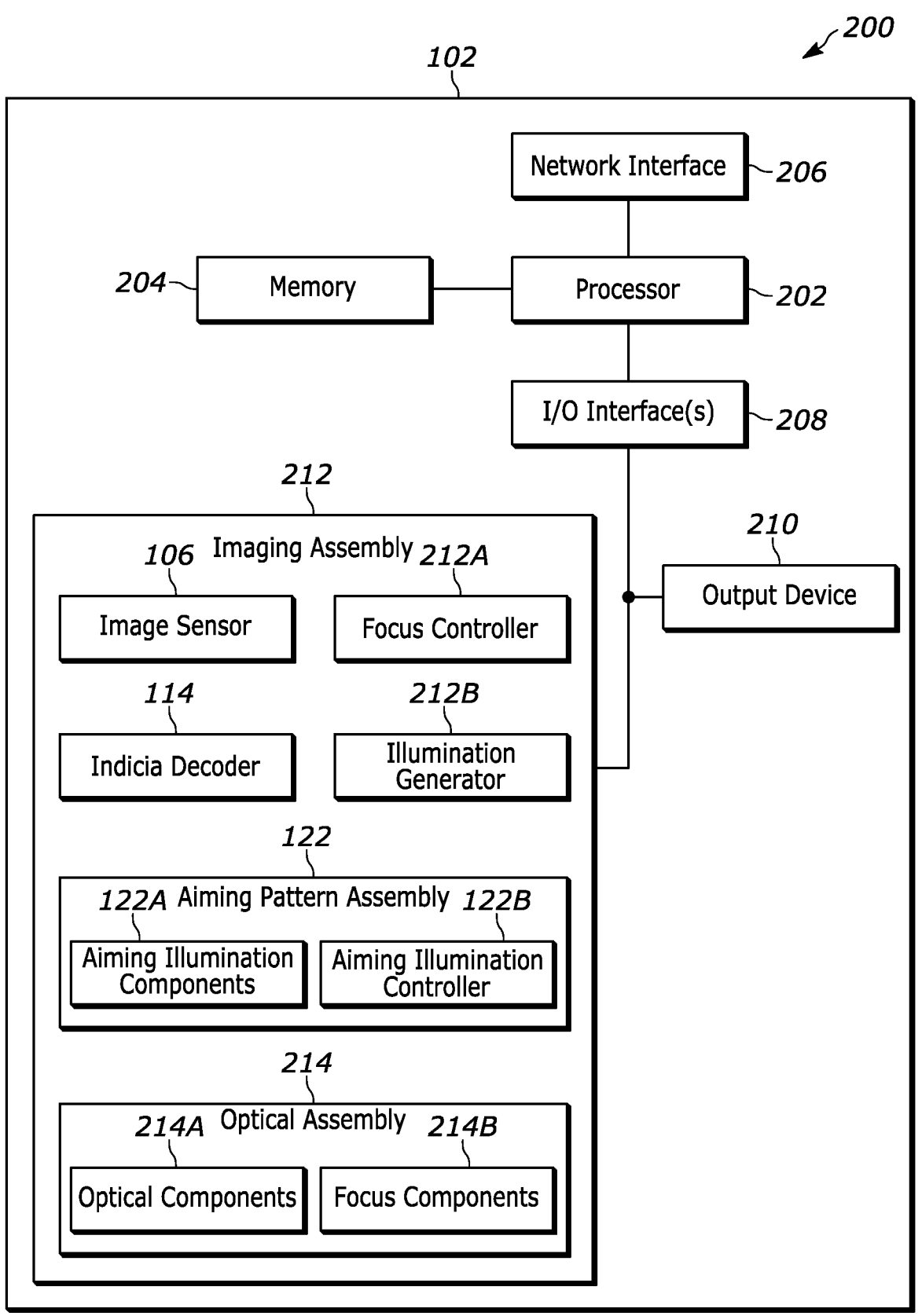
FIG. 2 is a block diagram representative of an example logic circuit for implementing the example scanning device of FIG. 1, in accordance with embodiments described herein.

FIG. 2 is a block diagram representative of an example logic circuit capable of implementing, for example, the example scanning device 100 of FIG. 1. The example logic circuit of FIG. 2 is a processing platform 200 capable of executing instructions to, for example, implement operations of the example methods described herein, as may be represented by the flowcharts of the drawings that accompany this description. Other example logic circuits capable of, for example, implementing operations of the example methods described herein include field programmable gate arrays (FPGAs) and application specific integrated circuits (ASICs).

The example processing platform 200 of FIG. 2 includes a processor 202 such as, for example, one or more microprocessors, controllers, and/or any suitable type of processor. The example processing platform 200 of FIG. 2 includes memory (e.g., volatile memory, non-volatile memory) 204 accessible by the processor 202 (e.g., via a memory controller). The example processor 202 interacts with the memory 204 to obtain, for example, machine-readable instructions stored in the memory 204 corresponding to, for example, the operations represented by the flowchart(s) of this disclosure. Additionally, or alternatively, machine-readable instructions corresponding to the example operations described herein may be stored on one or more removable media (e.g., a compact disc (CD), a digital versatile disc (DVD), removable flash memory, etc.) that may be coupled to the processing platform 200 to provide access to the machine-readable instructions stored thereon. The processor 202 and the memory 204 are disposed in the housing 102.

The example processing platform 200 of FIG. 2 includes one or more communication interfaces such as, for example, one or more network interfaces 206, and/or one or more input/output (I/O) interfaces 208 disposed in the housing 102. The communication interface(s) may enable the processing platform 200 of FIG. 2 to communicate with, for example, another device, system, host system (e.g., an inventory management system, a POS station, etc.), datastore, database, and/or any other machine.

The example processing platform 200 of FIG. 2 may include the network interface(s) 206 to enable communication with other machines (e.g., an inventory management system, a POS station, etc.) via, for example, one or more networks. The example network interface(s) 206 include any suitable type of communication interface(s) (e.g., wired and/or wireless interfaces) configured to operate in accordance with any suitable communication protocol(s). Example network interfaces 206 include a TCP/IP interface, a Wi-Fi™ transceiver (e.g., according to the IEEE 802.11x family of standards), an Ethernet transceiver, a cellular network radio, a satellite network radio, or any other suitable interface based on any other suitable communication protocols or standards.

The example, processing platform 200 of FIG. 2 may include the input/output (I/O) interface(s) 208 (e.g., a Bluetooth® interface, a near-field communication (NFC) interface, a universal serial bus (USB) interface, a serial interface, an infrared interface, etc.) to (1) enable receipt of user input (e.g., from the trigger 120 of FIG. 1, a touch screen, keyboard, mouse, touch pad, joystick, trackball, microphone, button, etc.), (2) communicate output data (e.g., mode change confirmations, visual indicators, instructions, data, images, etc.) to the user (e.g., via an output device 210, speaker, printer, haptic device, etc.), and/or (3) interact with other components of the handheld scanner 200 (e.g., an imaging assembly 212, the output device 210, etc.). Example output devices 210 may include a sound generation device, a haptic device, or the like.

To capture images of objects and/or barcodes on objects, the example processing platform 200 includes the example imaging assembly 212 disposed in the housing. The imaging assembly 212 includes the image sensor 106 under control of, for example, the processor 202 to capture image frames representative of the portion of an environment in which the example scanning device 100 is operating that falls within the imaging field of view 108 of the imaging assembly 212. The image sensor 106 includes a plurality of photosensitive elements forming a substantially flat surface. The processor 202 may be communicatively coupled to the imaging assembly 212 via the input/output (I/O) interface(s) 208.

The example imaging assembly 212 includes any number and/or type(s) indicia decoders 114 (e.g., the indicia decoder 114) to detect and/or decode indicia to determine the payload of the indicia. In some examples, the indicia decoder 114 is implemented by the processor 202. The indicia decoder 114, e.g., via the processor 202, conveys the payload of decoded indicia to a host system via a communication interface such as the network interface(s) 206 and/or the I/O interface(s) 208.

The example imaging assembly 212 includes an optical assembly 214 to form images of objects in the field of view 108 on the surface of the image sensor 106. The optical assembly 214 may include any number and/or type(s) of optical elements and/or components 214A including, for example, one or more lenses, filters, focus motors, apertures, lens holder, liquid lenses, or any other components and/or optical elements.

To focus the imaging assembly 212 on an object, the example imaging assembly 212 may include a focus controller 212A, and the optical assembly 214 may include any number and/or type(s) of focus components 214B (e.g., motors, liquid lenses, etc.). In some examples, the focus controller 212A is implemented by the processor 202. In some examples, the example imaging assembly 212 is a fixed-focus scanner.

To illuminate a target to be imaged, the example imaging assembly 212 may include the illumination generator 212B. The illumination generator 212B may emit light in the field of view 108 to, for example, facilitate autofocusing and/or improve the quality of image frames captured by the image sensor 106.

To generate illuminated aiming patterns, the example imaging assembly 212 may include the aiming pattern assembly 122. Generally, the aiming pattern assembly 122 is configured to generate light that is passed through the optical window 110 of the example scanning device 100 to provide a clear illuminated aiming pattern in the field of view 108. The aiming pattern assembly 122 may include aiming illumination components 122A, such as one or more light sources (e.g., lasers, LEDs, one or more apertures, one or more diffractive and/or refractive elements, etc.), and an aiming illumination controller 1226.

The aiming illumination controller 1226 may generally control the aiming illumination components 122A by, among other things, supplying various amounts of power to the components 122A. The aiming illumination controller 1226 may include a boost regulator (not shown) that is configured to supply a boost voltage to, for example, a laser diode (not shown) that is part of the aiming illumination components 122A. Moreover, the laser diode and the aiming illumination controller 1226 may be collectively referenced as a "laser drive subassembly" that provides electrically efficient laser light that may be used, for example, to aim the example scanning device 100.

The processor 202 may execute instructions (e.g., stored on the memory 204) comprising a boost servo algorithm that may adjust the boost voltage supplied by the boost regulator in order to supply an optimum voltage level to drive the laser diode. Accordingly, the boost servo algorithm (referenced herein as a "boost servo") may generally correspond to executable instructions that are configured to adjust the boost voltage output to an optimum level in order to drive the laser diode. For example, the processor 202 may cause a laser temperature sensor (not shown) included as part of the aiming illumination controller 1226 to obtain a temperature corresponding to a laser diode of the aiming illumination components 122A, and may cause the boost regulator to supply an optimum voltage to the laser diode in order to compensate for the changes in forward voltage requirements based on temperature changes during operation.

Figure 3:
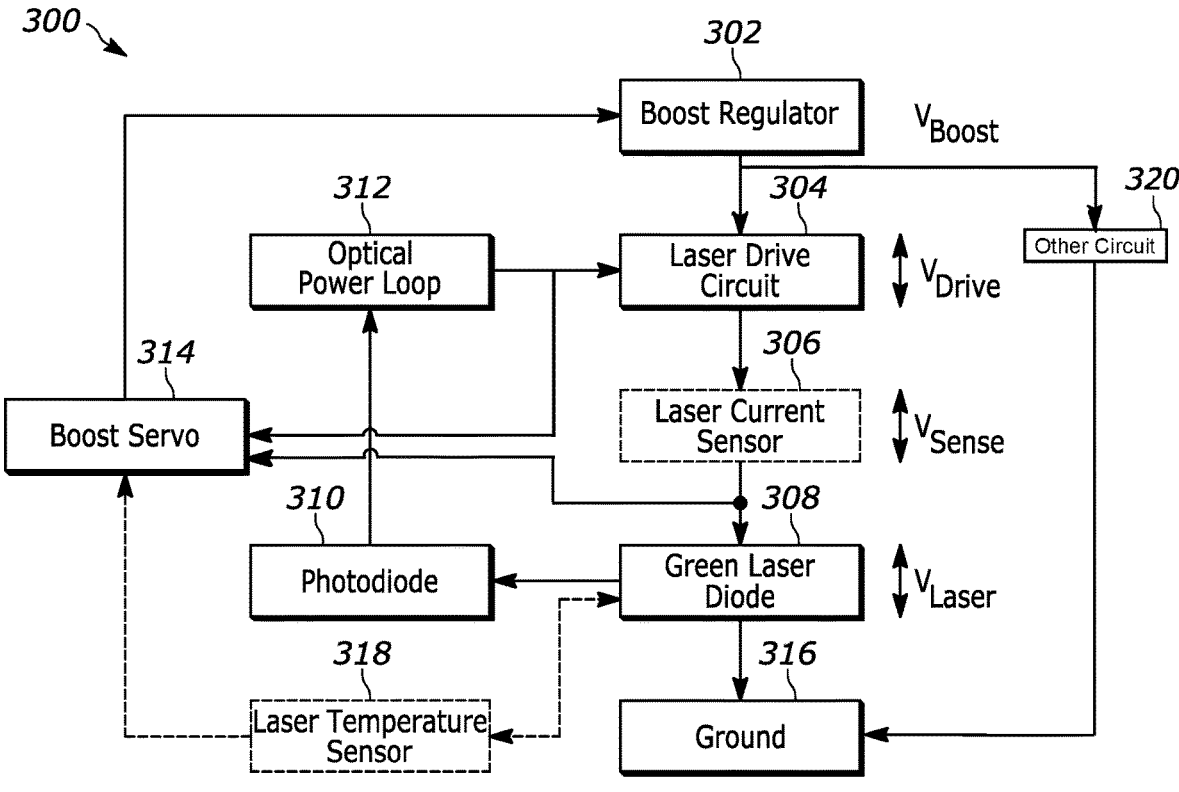
FIG. 3 illustrates an example driving circuit configuration to drive a green laser diode, in accordance with various embodiments of the present invention.

FIG. 3 illustrates an example driving circuit configuration 300 to drive a green laser diode, in accordance with various embodiments of the present invention. Generally, the example driving circuit configuration 300 may adaptively supply various voltage outputs to drive a green laser diode in response to changing operating conditions within the configuration 300 in order to maintain a constant optical power drive. As illustrated, FIG. 3 shows two servo systems with one regulating optical power of the laser diode (e.g., by photodiode 310 and optical power loop 312), and the other servo system optimizes the electrical power delivered to the laser diode (e.g., by boost servo 314). The example driving circuit configuration 300 may broadly comprise a discrete time feedback loop that regulates the voltage supplied to the diode in a manner that optimizes electrical power efficiency for the green laser diode. Of course, while described herein as a green laser diode, it should be appreciated that such a configuration 300 may supply voltage to any suitable illumination source (e.g., red LED) and/or otherwise circuit component.

The example driving circuit configuration 300 may include a boost regulator 302 that is configured to supply a boost voltage $V_{BOOST}$ to a laser drive circuit 304, an optional laser current sensor 306, and a green laser diode 308. The boost regulator 302 may receive input power from an input power supply (not shown), and may vary the boost voltage $V_{BOOST}$ in response to determinations made by a boost servo 314. The laser drive circuit 304 may utilize a drive voltage $V_{DRIVE}$ to drive the green laser diode 308, the laser current sensor 306 may optionally utilize a sense voltage $V_{SENSE}$ to measure the current flowing to the green laser diode 308, and the green laser diode 308 may utilize a laser voltage $V_{LASER}$ to output green laser light, for example, as an aiming pattern for the example scanning device 100. The boost voltage may therefore be defined as:

$$V_{BOOST} = V_{DRIVE} + V_{SENSE} + V_{LASER} \qquad (1)$$

Consequently, the boost voltage $V_{BOOST}$ must be large enough to enable the laser drive circuit 304 to drive the green laser diode 308 without substantially exceeding the drive voltage $V_{DRIVE}$ requirements, thereby causing the example driving circuit configuration 300 to suffer from electrical inefficiency. Moreover, the green laser diode 308 may have a range of forward voltages that may be used to efficiently drive the diode 308 based on the operating characteristics (e.g., temperature) of the diode 308. For example, when the green laser diode 308 is completely cold (e.g., has not yet begun operation) the diode 308 may require over 9 V to generate green laser light. By contrast, when the green laser diode 308 is fully warmed up (e.g., has been in operation for a significant duration) the diode 308 may require less than 5 V to generate green laser light. Thus, the boost regulator 302 and boost servo 314 may actively adjust the boost voltage $V_{BOOST}$ during operation of the example driving circuit configuration 300 in order to efficiently drive all components of the configuration 300.

In particular, the boost regulator 302 may have a programmable output to enable adjustments to the boost voltage $V_{BOOST}$ based on the voltage requirements of the laser drive circuit 304, the green laser diode 308, and optionally, the laser current sensor 306. It should be noted that the sense voltage $V_{SENSE}$ is typically very small relative to the drive voltage $V_{DRIVE}$ and the laser voltage $V_{LASER}$, so it may not significantly influence the changes made to the boost voltage $V_{BOOST}$ at any particular time. Regardless, the boost regulator 302 may initially provide a maximum boost voltage $V_{MAX}$ sufficient to drive all components of the example driving circuit configuration 300, and the boost servo 314 may obtain/measure the laser voltage $V_{LASER}$. The boost servo 314 may not directly measure the boost voltage, and may instead program the parameter associated with the boost voltage $V_{BOOST}$, and assume that the boost regulator 302 delivers that programmed voltage upon receiving the signal from the boost servo 314. For example, the boost servo 314 may obtain/measure the laser voltage $V_{LASER}$ and may assume that the boost voltage $V_{BOOST}$ is the maximum boost voltage $V_{MAX}$. Moreover, the boost servo 314 may typically measure the laser voltage $V_{LASER}$ at the anode of the green laser diode 308, however, in certain aspects, the boost servo 314 may measure the laser voltage $V_{LASER}$ at the cathode of the green laser diode 308.

With the laser voltage $V_{LASER}$ and maximum boost voltage $V_{MAX}$, the boost servo 314 may determine whether or not the voltage difference between the maximum boost voltage $V_{MAX}$ and the laser voltage $V_{LASER}$ exceeds the drive voltage $V_{DRIVE}$, and if not, the boost servo 314 may cause the boost regulator 302 to continue providing the maximum boost voltage $V_{MAX}$. If the boost servo 314 determines that the voltage difference between the maximum boost voltage $V_{MAX}$ and the laser voltage $V_{LASER}$ does exceed the drive voltage $V_{DRIVE}$, then the boost servo 314 may cause the boost regulator 302 to provide an optimum voltage $V_{OPTIMUM}$, based on the excess voltage. For example, if the boost servo 314 determines that the voltage difference between the maximum boost voltage $V_{MAX}$ and the laser voltage $V_{LASER}$ exceeds the drive voltage by 1 V, then the boost servo 314 may determine that the optimum voltage $V_{OPTIMUM}$ is 1 V less than the maximum boost voltage $V_{MAX}$, and may accordingly cause the boost regulator to output an optimum boost voltage of $V_{OPTIMUM} = V_{MAX} - 1V$. In this manner, the boost servo 314 causes the boost regulator 302 to output a dynamic and more electrically efficient boost voltage $V_{BOOST}$ to drive the laser drive circuit 304 and the green laser diode 308 than conventional systems that utilize a static boost voltage (e.g., maximum boost voltage $V_{MAX}$), and thereby waste significant amounts of power.

Moreover, in certain aspects, the green laser diode 308 may be pulsed, such that the diode 308 has a duty cycle that is less than 100%. In these aspects, other components of the example driving circuit configuration 300 and/or other electrically coupled circuits (not shown) (e.g., additional illumination components, buck drives, etc.) may require power, despite the boost voltage $V_{BOOST}$ not driving the green laser diode 308. The boost servo 314 may determine a low voltage $V_{LOW}$ that is sufficient to power these additional components during periods when the green laser diode 308 is inactive (e.g., between laser pulses). Thus, the boost servo 314 may cause the boost regulator 302 to output the optimum boost voltage $V_{OPTIMUM}$ when the green laser diode 308 is emitting a pulse, and may cause the regulator 302 to output the low voltage $V_{LOW}$ when the diode 308 is inactive. For example, if the optimum boost voltage $V_{OPTIMUM}$ is 8 V and the low voltage $V_{LOW}$ is 3 V, then the boost servo 314 may cause the boost regulator 302 to output 8 V when the green laser diode 308 is supposed to emit a light pulse, and the servo 314 may cause the regulator 302 to output 3 V when the diode 308 is not supposed to emit a light pulse (e.g., inactive, between pulses). In this manner, the boost servo 314 and boost regulator 302 further improve over conventional systems that utilize a static boost voltage (e.g., maximum boost voltage $V_{MAX}$) by further reducing the boost voltage $V_{BOOST}$ supplied by the regulator 302 to a low voltage $V_{LOW}$ during periods of diode inactivity, thereby further reducing the excess power consumption of pulsed laser circuits.

In some instances, the green laser diode 308 may remain inactive for long enough to cool down in between subsequent driving events (e.g., emitting a laser pulse). In these instances, the optimum boost voltage $V_{OPTIMUM}$ may be insufficient to drive the diode 308, and the boost servo 314 may need to determine an increased optimum driving voltage based on the current operating conditions of the diode 308. Alternatively, the green laser diode 308 may remain active for long enough to heat up substantially, and thereby reduce the voltage requirements for driving the diode 308. In that case, the optimum boost voltage $V_{OPTIMUM}$ may exceed what is required to drive the diode 308, and the boost servo 314 may need to determine a decreased optimum driving voltage based on the current operating conditions of the diode 308. In either case, the boost servo 314 may actively update the optimum boost voltage $V_{OPTIMUM}$ at a refresh frequency (e.g., once per x number of laser cycles, once every x milliseconds, etc.) required to drive all components of the example driving circuit configuration 300 and/or any electrically coupled components (e.g., additional illumination components, buck drives, etc.).

Further, in some aspects, the boost servo 314 may also revert to the maximum boost voltage $V_{MAX}$, after a timeout period in between laser pulses. For example, a user may pull the trigger 120 of the example scanning device 100, during which time, the boost servo 314 determines an optimum boost voltage $V_{OPTIMUM}$. After the user releases the trigger 120, the user may subsequently pull the trigger after a duration that exceeds the timeout period, such that the boost servo 314 automatically causes the boost regulator 302 to output the maximum boost voltage $V_{MAX}$ prior to determining an optimum boost voltage $V_{OPTIMUM}$ corresponding to the operating status of the green laser diode 308 during the current trigger pull.

The example driving circuit configuration 300 also includes a photodiode 310 and an optical power loop 312 that are configured to maintain a constant optical power output of the green laser diode 308. The photodiode 310 may be included as part of the green laser diode 308, and may generate a photocurrent corresponding to the laser voltage $V_{LASER}$, which the optical power loop 312 receives and converts into a voltage signal that may adjust the output of the laser drive circuit 304 based on the operating conditions of the green laser diode 308 indicated by the photocurrent. The optical power loop 312 may condition the voltage signal, for example, using an error amplifier (not shown) and a calibrated reference voltage in order to maintain constant optical power of the green laser diode 308. The output of this error amplifier may be periodically monitored by the boost servo 314 to be sure there is adequate headroom to maintain optical output power, whereby the boost servo 314 may make changes to increase boost voltage to add needed headroom. Moreover, the optical power loop 312 output (e.g., a gate voltage) may be received by the boost servo 314, and may be used by the boost servo 314 to determine an adjustment to the voltage supplied by the boost regulator 302, as described herein.

Additionally, the example driving circuit configuration 300 includes a ground 316 and an optional laser temperature sensor 318. The ground 316 may be the electrical ground of the example driving circuit configuration 300, such that each of the voltages (e.g., $V_{BOOST}$, $V_{DRIVE}$, $V_{SENSE}$, and $V_{LASER}$) may be measured relative to the ground 316. The current path flowing to the green laser diode 308 may thereby be described as flowing from the boost regulator 302, to the laser drive circuit 304, optionally through the laser current sensor 306, through the green laser diode 308, and finally to the ground 316. The optional laser temperature sensor 318 may be included as part of the green laser diode 308 and/or otherwise connected to the diode 308 in order to measure the operating temperature of the diode 308 before, during, and after periods of activity (e.g., providing aiming illumination). In certain aspects, the optional laser temperature sensor 318 may be communicatively coupled with the boost servo 314, such that the boost servo 314 may receive laser operating temperatures from the sensor 318 to determine a change to the boost voltage $V_{BOOST}$ supplied by the boost regulator 302.

The example driving circuit configuration 300 also includes another circuit 320 that may generally include other electronic component(s) that are electrically coupled to the boost regulator 302. For example, the other circuit 320 may include an illumination LED, a drive circuit, and/or any other suitable electronic component or combinations thereof. As illustrated in FIG. 3, the other circuit 320 may also be electrically coupled to the ground 316, such that the both the green laser diode 308 and the other circuit 320 receive input drive voltage from the boost regulator 302 and discharge to the ground 316.

Figure 4:
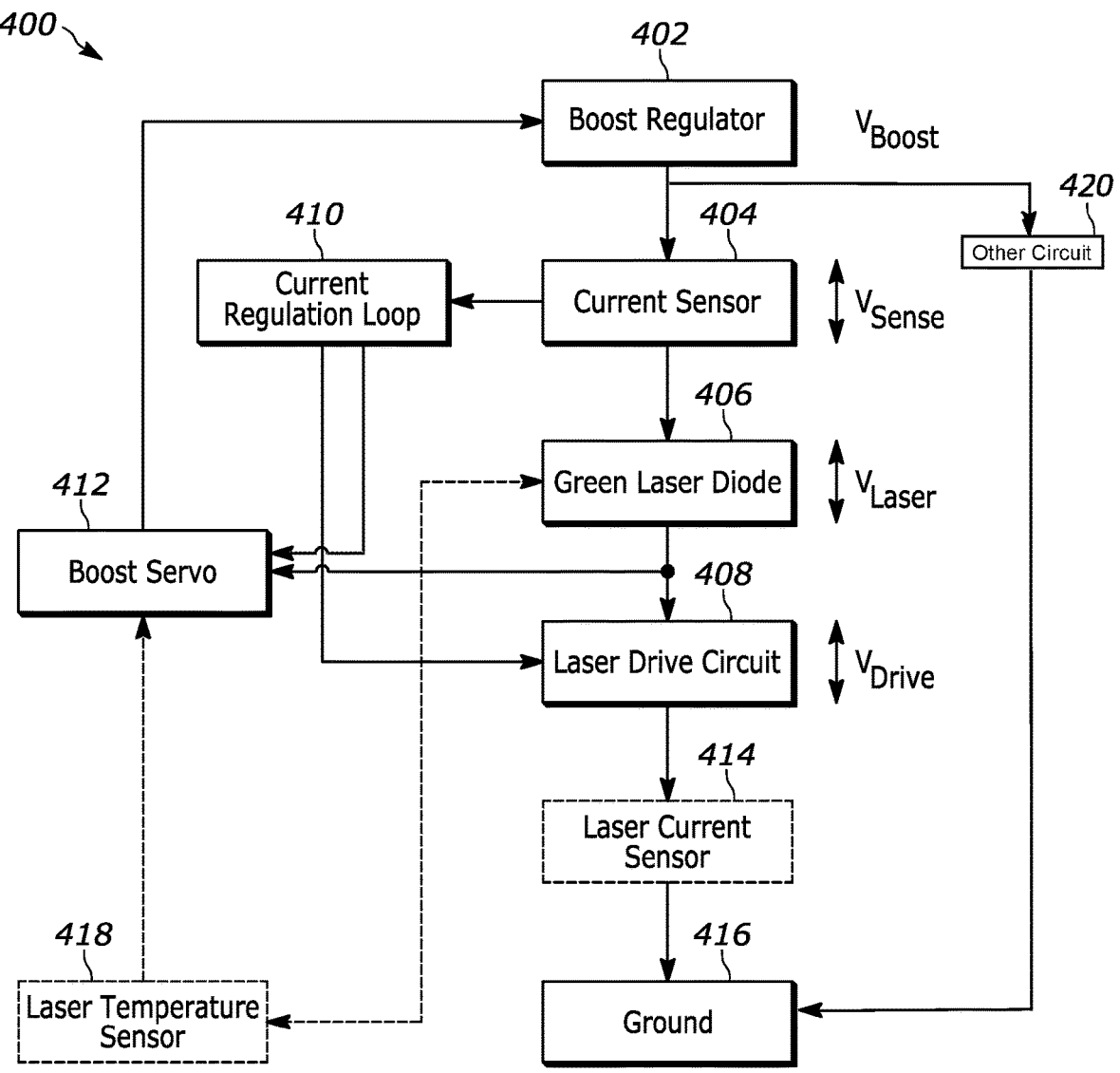
FIG. 4 illustrates another example driving circuit configuration to drive a green laser diode, in accordance with various embodiments of the present invention.

FIG. 4 illustrates another example driving circuit configuration 400 to drive a green laser diode 406, in accordance with various embodiments of the present invention. Similar to the example driving circuit configuration 300 illustrated in FIG. 3, the configuration 400 includes a boost regulator

402, a green laser diode 406, a laser drive circuit 408, a boost servo 412, an optional laser current sensor 414, a ground 416, and an optional laser temperature sensor 418. Moreover, the example driving circuit configuration 400 may perform similar voltage adjustment functions as previously described in reference to the example driving circuit configuration 300 in FIG. 3. However, the configuration 400 differs from the configuration 300 illustrated in FIG. 3 in two notable ways: 1) green laser diode 406 represents a floating case laser without a photodiode (e.g., photodiode 310), and 2) laser drive circuit 408 is driven by a current regulation loop 410 in a constant electrical current mode instead of a constant optical power mode.

In any event, the example driving circuit configuration 400 may adaptively supply various voltage outputs to drive the green laser diode 406 in response to changing operating conditions within the configuration 400 in order to maintain a constant electrical current. The example driving circuit configuration 400 may broadly comprise a discrete time feedback loop that regulates the voltage supplied to the diode 406 in a manner that optimizes electrical power efficiency for the green laser diode 406. Of course, while described herein as a green laser diode, it should be appreciated that such a configuration 400 may supply voltage to any suitable illumination source (e.g., red LED) and/or otherwise circuit component.

The boost regulator 402 is configured to supply a boost voltage $V_{BOOST}$ to the laser drive circuit 408, a current sensor 404 (also referenced herein as a "current sense circuit"), and the green laser diode 406. The boost regulator 402 may receive input power from an input power supply (not shown), and may vary the boost voltage $V_{BOOST}$ in response to determinations made by a boost servo 412. The laser drive circuit 408 may utilize a drive voltage $V_{DRIVE}$ to drive the green laser diode 406, the current sensor 404 may utilize a sense voltage $V_{SENSE}$ to measure the current flowing to the green laser diode 406, and the green laser diode 406 may utilize a laser voltage $V_{LASER}$ to output green laser light, for example, as an aiming pattern for the example scanning device 100. The boost voltage may therefore be defined as provided in equation (1).

Consequently, the boost voltage $V_{BOOST}$ must be large enough to enable the laser drive circuit 408 to drive the green laser diode 406 without substantially exceeding the drive voltage $V_{DRIVE}$ requirements, thereby causing the example driving circuit configuration 400 to suffer from electrical inefficiency. Moreover, the green laser diode 406 may have a range of forward voltages that may be used to efficiently drive the diode 406 based on the operating characteristics (e.g., temperature) of the diode 406. For example, when the green laser diode 406 is completely cold (e.g., has not yet begun operation) the diode 406 may require over 9 V to generate green laser light. By contrast, when the green laser diode 406 is fully warmed up (e.g., has been in operation for a significant duration) the diode 406 may require less than 5 V to generate green laser light. Thus, the boost regulator 402 and boost servo 412 may actively adjust the boost voltage $V_{BOOST}$ during operation of the example driving circuit configuration 400 in order to efficiently drive all components of the configuration 400.

In particular, the boost regulator 402 may have a programmable output to enable adjustments to the boost voltage $V_{BOOST}$ based on the voltage requirements of the laser drive circuit 408, the green laser diode 406, and the current sensor 404. It should be noted that the sense voltage $V_{SENSE}$ is typically very small relative to the drive voltage $V_{DRIVE}$ and the laser voltage $V_{LASER}$, so it may not significantly influence the changes made to the boost voltage $V_{BOOST}$ at any particular time. Regardless, the boost regulator 402 may initially provide a maximum boost voltage $V_{MAX}$ sufficient to drive all components of the example driving circuit configuration 400, and the boost servo 412 may obtain/measure the laser voltage $V_{LASER}$ and the maximum boost voltage $V_{MAX}$ for comparison. The boost servo 412 may typically measure the laser voltage $V_{LASER}$ at the cathode of the green laser diode 406, however, in certain aspects, the boost servo 412 may measure the laser voltage $V_{LASER}$ at the anode of the green laser diode 406.

With the laser voltage $V_{LASER}$ and maximum boost voltage $V_{MAX}$, the boost servo 412 may determine whether or not the voltage difference between the maximum boost voltage $V_{MAX}$ and the laser voltage $V_{LASER}$ exceeds the drive voltage $V_{DRIVE}$, and if not, the boost servo 412 may cause the boost regulator 402 to continue providing the maximum boost voltage $V_{MAX}$. If the boost servo 412 determines that the voltage difference between the maximum boost voltage $V_{MAX}$ and the laser voltage $V_{LASER}$ does exceed the drive voltage $V_{DRIVE}$, then the boost servo 412 may cause the boost regulator 402 to provide an optimum voltage $V_{OPTIMUM}$, based on the excess voltage. For example, if the boost servo 412 determines that the voltage difference between the maximum boost voltage $V_{MAX}$ and the laser voltage $V_{LASER}$ exceeds the drive voltage by 1.5 V, then the boost servo 412 may determine that the optimum voltage $V_{OPTIMUM}$ is 1.5 V less than the maximum boost voltage $V_{MAX}$, and may accordingly cause the boost regulator to output an optimum boost voltage of $V_{OPTIMUM}=V_{MAX}-1.5$ V. In this manner, the boost servo 412 causes the boost regulator 402 to output a dynamic and more electrically efficient boost voltage $V_{BOOST}$ to drive the laser drive circuit 408 and the green laser diode 406 than conventional systems that utilize a static boost voltage (e.g., maximum boost voltage $V_{MAX}$), and thereby waste significant amounts of power.

Moreover, in certain aspects, the green laser diode 406 may be pulsed, such that the diode 406 has a duty cycle that is less than 100%. In these aspects, other components of the example driving circuit configuration 400 and/or other electrically coupled circuits (not shown) (e.g., additional illumination components, buck drives, etc.) may require power, despite the boost voltage $V_{BOOST}$ not driving the green laser diode 406. The boost servo 412 may determine a low voltage $V_{LOW}$ that is sufficient to power these additional components during periods when the green laser diode 406 is inactive (e.g., between laser pulses). Thus, the boost servo 412 may cause the boost regulator 402 to output the optimum boost voltage $V_{OPTIMUM}$ when the green laser diode 406 is emitting a pulse, and may cause the regulator 402 to output the low voltage $V_{LOW}$ when the diode 406 is inactive. For example, if the optimum boost voltage $V_{OPTIMUM}$ is 7 V and the low voltage $V_{LOW}$ is 4 V, then the boost servo 412 may cause the boost regulator 402 to output 7 V when the green laser diode 406 is supposed to emit a light pulse, and the servo 412 may cause the regulator 402 to output 4 V when the diode 406 is not supposed to emit a light pulse (e.g., inactive, between pulses). In this manner, the boost servo 412 and boost regulator 402 further improve over conventional systems that utilize a static boost voltage (e.g., maximum boost voltage $V_{MAX}$) by further reducing the boost voltage $V_{BOOST}$ supplied by the regulator 402 to a low voltage $V_{LOW}$ during periods of diode inactivity, thereby further reducing the excess power consumption of pulsed laser circuits.

In some instances, the green laser diode 406 may remain inactive for long enough to cool down in between subsequent driving events (e.g., emitting a laser pulse). In these instances, the optimum boost voltage $V_{OPTIMUM}$ may be insufficient to drive the diode 406, and the boost servo 412 may need to determine an increased optimum driving voltage based on the current operating conditions of the diode 406. Alternatively, the green laser diode 406 may remain active for long enough to heat up substantially, and thereby reduce the voltage requirements for driving the diode 406. In that case, the optimum boost voltage $V_{OPTIMUM}$ may exceed what is required to drive the diode 406, and the boost servo 412 may need to determine a decreased optimum driving voltage based on the current operating conditions of the diode 406. In either case, the boost servo 412 may actively update the optimum boost voltage $V_{OPTIMUM}$ at a refresh frequency (e.g., once per x number of laser cycles, once every x milliseconds, etc.) required to drive all components of the example driving circuit configuration 400 and/or any electrically coupled components (e.g., additional illumination components, buck drives, etc.).

Further, in some aspects, the boost servo 412 may also revert to the maximum boost voltage $V_{MAX}$, after a timeout period in between laser pulses. For example, a user may pull the trigger 120 of the example scanning device 100, during which time, the boost servo 412 determines an optimum boost voltage $V_{OPTIMUM}$ After the user releases the trigger 120, the user may subsequently pull the trigger after a duration that exceeds the timeout period, such that the boost servo 412 automatically causes the boost regulator 402 to output the maximum boost voltage $V_{MAX}$ prior to determining an optimum boost voltage $V_{OPTIMUM}$ corresponding to the operating status of the green laser diode 406 during the current trigger pull.

The example driving circuit configuration 400 also includes a current regulation loop 410 that is configured to maintain a constant electrical current flowing from the boost regulator 402 to the ground 416. The current sense circuit 404 generates a voltage feedback signal corresponding to the laser voltage $V_{LASER}$, which the current regulation loop 410 receives and utilizes to maintain a constant electrical current. The current regulation loop 410 may condition the voltage feedback signal, for example, using an error amplifier (not shown) and a calibrated reference voltage in order to maintain the constant electrical current flowing from the boost regulator 402 to the ground 416. Moreover, the current regulation loop 410 output may be received by the boost servo 412, and may be used by the boost servo 412 to determine an adjustment to the voltage supplied by the boost regulator 402, as described herein.

Generally, when the green laser diode 406 is driven at a constant current, the optical power of the diode 406 may decrease over time as the temperature of the diode 406 increases during operation. In other words, as the voltage requirements to drive the green laser diode 406 decrease with increasing temperature, the optical power output of the diode 406 similarly decreases when the electrical current flowing through the diode 406 is held constant. As a result, the optical power of the green laser diode 406 may be highest during initial operation when the diode 406 is cold.

Thus, in configurations similar to the example driving circuit configuration 400 where constant optical power may not be the primary concern, the constant current loop 410 may attempt to maintain a maximum cold-adjusted current, such that the optical power will only decrease as the temperature increases during operation. Alternatively, the optional laser temperature sensor 318 may be utilized with a temperature reference table (not shown) to correct for optical power loss by increasing the electrical current flowing through the green laser diode 406.

As previously mentioned, the example driving circuit configuration 400 also includes a ground 416 and an optional laser temperature sensor 418. The ground 416 may be the electrical ground of the example driving circuit configuration 400, such that each of the voltages (e.g., $V_{BOOST}$, $V_{DRIVE}$, $V_{SENSE}$, and $V_{LASER}$) may be measured relative to the ground 416. The current path flowing to the green laser diode 406 may thereby be described as flowing from the boost regulator 402, to the current sensor 404, through the green laser diode 406, through the laser drive circuit 408, optionally through the laser current sensor 414, and finally to the ground 416. The optional laser temperature sensor 418 may be included as part of the green laser diode 406 and/or otherwise connected to the diode 406 in order to measure the operating temperature of the diode 406 before, during, and after periods of activity (e.g., providing aiming illumination). In certain aspects, the optional laser temperature sensor 418 may be communicatively coupled with the boost servo 412, such that the boost servo 412 may receive laser operating temperatures from the sensor 418 to determine a change to the boost voltage $V_{BOOST}$ supplied by the boost regulator 402.

The example driving circuit configuration 400 also includes another circuit 420 that may generally include other electronic component(s) that are electrically coupled to the boost regulator 402. For example, the other circuit 420 may include an illumination LED, a drive circuit, and/or any other suitable electronic component or combinations thereof. As illustrated in FIG. 4, the other circuit 420 may also be electrically coupled to the ground 416, such that the both the green laser diode 406 and the other circuit 420 receive input drive voltage from the boost regulator 402 and discharge to the ground 416.

FIG. 5 illustrates an example method 500 for driving a green laser diode, in accordance with various embodiments of the present invention. It should be understood that, in certain embodiments, any of the blocks of the method 500 may be performed by any of the example scanning device 100, the aiming pattern assembly 122, the aiming illumination controller 122B, the processor(s) 202, and/or any other suitable device.

The method 500 includes outputting, by a boost regulator, a maximum boost voltage to drive a green laser diode (block 502). Generally, and as previously mentioned, the maximum boost voltage may be sufficient to drive the green laser diode and numerous other additional electrical components (e.g., laser drive circuit 304, 408, laser current sensor 306, current sense circuit 404). The method 500 may also include measuring, by a boost servo, a laser voltage of the green laser diode (block 504). The boost servo may generally measure the laser voltage at the anode of the green laser diode, but in certain aspects, the boost servo may measure the laser voltage at a cathode of the green laser diode.

The method 500 also includes calculating, by the boost servo, a voltage difference between the laser voltage and the maximum boost voltage (block 506). In certain aspects, the boost servo may additionally measure a laser current sense voltage corresponding to an electrical current level that is flowing through the green laser diode. In these aspects, the boost servo may calculate the voltage difference by subtracting both the laser voltage and the laser current sense voltage from the maximum boost voltage.

The method 500 also includes comparing, by the boost servo, the voltage difference to a drive voltage corresponding to a laser drive circuit to determine whether or not the voltage difference exceeds the drive voltage (block 508). As a first example, the boost servo may determine that the voltage difference between the laser voltage (and optionally the laser current sense voltage) and the maximum boost voltage is 3 V, and the drive voltage may be 2 V. In this first example, the boost servo may compare the voltage difference to the drive voltage to determine that the voltage difference exceeds the drive voltage by 1 V. As a second example, the boost servo may determine that the voltage difference between the laser voltage (and optionally the laser current sense voltage) and the maximum boost voltage is 2 V, and the drive voltage may be 2 V. In this second example, the boost servo may compare the voltage difference to the drive voltage to determine that the voltage difference equals the drive voltage. In either case, the boost servo may determine a change (e.g., reduction) to the maximum boost voltage (e.g., 1 V and 0 V, respectively) by which the boost servo may achieve more electrically efficient operation of the driving circuit.

In certain aspects, the boost servo may determine whether or not the drive voltage corresponding to the laser drive circuit satisfies a drive voltage threshold before, during, or after comparing the voltage difference to the drive voltage. For example, the boost servo may monitor an optical power control loop (e.g., optical power loop 312) that is configured to regulate the drive voltage at a monitoring frequency to determine whether or not the drive voltage satisfies the drive voltage threshold. The monitoring frequency may be any suitable frequency (e.g., once per x number of laser cycles, once every x milliseconds, etc.), and may enable the boost servo to determine whether or not the drive voltage needs to be adjusted, thereby affecting the overall voltage requirements from the boost regulator. The drive voltage threshold may be any suitable voltage value, percentage deviation from a required value, and/or any other suitable numerical value corresponding to the drive voltage or combinations thereof. In this manner, the boost servo can validate that the drive voltage used to compare the voltage difference will provide an accurate voltage excess which the boost voltage may use to adjust the boost voltage supplied by the boost regulator.

Accordingly, responsive to determining that the voltage difference exceeds the drive voltage by an excess voltage, the method 500 also includes causing, by the boost servo, the boost regulator to output an optimum voltage based on the excess voltage (block 510). Returning to the above examples, the boost servo may determine that the maximum boost voltage should be reduced by 1 V in the first example, such that the optimum voltage is 1 V less than the maximum boost voltage. In the above second example, the boost servo may determine that the voltage difference does not exceed the drive voltage (they are equivalent), such that the optimum voltage is the maximum boost voltage.

In certain aspects, the laser voltage is a first laser voltage, the optimum voltage is a first optimum voltage, the voltage difference is a first voltage difference, and the excess voltage is a first excess voltage. In these aspects, the boost servo may subsequently measure a second laser voltage of the green laser diode and the first optimum boost voltage. Thereafter, the boost servo may calculate a second voltage difference between the second laser voltage and the first optimum boost voltage, and may compare the second voltage difference to the drive voltage to determine whether or not the second voltage difference exceeds the drive voltage. Responsive to determining that the second voltage difference exceeds the drive voltage by a second excess voltage, the boost servo may cause the boost regulator to output a second optimum voltage based on the second excess voltage.

As an example, the drive voltage may be 1.5 V, the first laser voltage may be 6 V, and the first optimum voltage may be 8 V. The boost servo may measure a second laser voltage of the green laser diode after a first period of operation, and the second laser voltage may be 5.5 V as a result of increasing temperature during operation. The boost servo may calculate the second voltage difference by subtracting the second laser voltage (5.5 V) from the first optimum voltage (8 V) to determine a second voltage difference of 2.5 V. The boost servo may compare the second voltage difference (2.5 V) to the drive voltage (1.5 V) to determine that the second voltage difference exceeds the drive voltage by 1 V. As a result, the boost servo may cause the boost regulator to output a second optimum voltage of 7 V by subtracting 1 V from the first optimum voltage (8 V).

In some aspects, the boost servo may obtain a laser temperature using a temperature sensor. In these aspects, the boost servo may also obtain a lookup optimum voltage from a temperature reference table based on the laser temperature. The boost servo may also compare the optimum voltage to the lookup optimum voltage to determine a change to the optimum voltage. For example, the optimum voltage output by the boost regulator may be 9 V, and the laser voltage may be 7 V. In this example, the temperature sensor may measure the temperature of the laser and/or operating environment, may send that temperature to the boost servo, and the boost servo may obtain a lookup optimum voltage of 6 V to drive the green laser diode from the temperature reference table based on the temperature obtained from the temperature sensor. Thus, the boost servo may compare the optimum voltage (9 V) and/or the laser voltage (7 V) to the lookup optimum voltage (6 V) to determine that the optimum voltage may be decreased by 1 V without sacrificing laser drive.

Additionally, or alternatively, in certain aspects, the boost servo may be calibrated to identify a room temperature laser forward voltage, and may be configured to estimate an optimal boost voltage as a function of temperature. As a particular time, the boost servo may obtain a laser temperature from a temperature sensor, and may then calculate an estimated optimal boost voltage based on the room temperature laser forward voltage. The boost servo may then cause the boost regulator to output the estimated optimal boost voltage.

In some aspects, the boost servo may adjust an input current to the boost regulator in order for the boost regulator to output an optimum power based on the excess voltage. The boost servo may adjust the input current in response to determining that the voltage difference exceeds the drive voltage by an excess voltage. In this manner, the input power to the boost regulator may be optimized by adjusting the input current instead of and/or in addition to the input voltage by the boost servo to match the power needed by the load of the laser drive components. This will improve efficiency and reduce peak current needed from the components by indirectly reducing the boost voltage as a result of reducing the input current to the boost regulator.

The method 500 also includes calculating, by the boost servo, a low voltage configured to drive at least one additional component that is electrically coupled to the boost regulator when the green laser diode is inactive (block 512). In certain aspects, the at least one additional component is an illumination light emitting diode (LED). However, and as previously mentioned, the at least one additional component may be any suitable component that is electrically coupled with the boost regulator. For example, the low voltage output by the boost regulator may be used to drive additional buck drives on other circuits that are uninvolved with driving the green laser diode when the diode is not actively emitting laser pulses.

Responsive to the green laser diode being inactive, the method 500 also includes the boost servo causing the boost regulator to output the low voltage to power the at least one additional component (block 514). In certain aspects, the boost servo may determine that the green laser diode has been inactive for greater than a timeout interval, and may cause the boost regulator to output the maximum boost voltage to drive the green laser diode. Alternatively, the boost servo may determine that the green laser diode has been inactive for less than the timeout interval, and may cause the boost regulator to output the optimum voltage to drive the green laser diode, because the diode has not had enough time to cool down sufficiently to require the maximum boost voltage for driving. The timeout interval may be any suitable period of time.

Additionally, in some aspects, the boost servo may determine that the laser diode has been active for greater than an activity duration threshold. In response to determining that the laser diode has been active for greater than the activity duration threshold the boost servo may measure the laser voltage at an anode of the laser diode and may calculate the voltage difference between the laser voltage at the anode of the laser diode and the optimum voltage. Thus, the voltage difference measured by the boost servo may be measured between the gate voltage provided by the optical power control loop and the laser voltage and/or the between the laser diode anode and the optimum voltage. Of course, it should be appreciated that either measurement may be suitable, and that various factors (e.g., self-heating effects of the laser diode) may cause either measurement to be more reliable at any particular time.

As noted above, scanning devices such as barcode imagers that use green laser sources in aiming assemblies are also limited due to high operating voltages, which result in high heat, and due to shortened laser lifespans. While green laser sources can produce higher contrast over a read laser sources, in barcode imaging applications, green laser sources are more susceptible to saturation in ambient light. As a result, green laser sources are typically operated at higher optical power output levels, but that exacerbates the heat dissipation and laser degradation issues.

In response, in various examples, the scanning devices herein (e.g., barcode imagers) may include techniques for controlling the laser drive of an aiming assembly, in particular, one that uses a green laser source, such as the aiming pattern assembly 122. In some examples, a barcode imager includes, such as the imaging assembly 212 of the scanning device 100, configured to capture images over a field of view of the barcode imager, where each image is captured during a frame duration of the barcode imager. In some examples, a controller, such as the aiming illumination controller 122B, controls the aiming assembly by controlling a drive mode thereof. In particular, the controller 122B may be configured to determine an optimum duty cycle value for the aiming pattern generated by the aiming assembly 122. For example, when the duty cycle is larger than an optimum value, heat dissipation increases, at the same visual brightness of the aiming pattern; the latter being limited by the frame-averaged radiation power constraint. When the duty cycle is smaller than the optimum value, the visual brightness of the aiming pattern decreases; the latter being limited by the peak pulse optical power constraint. As discussed further, an optimum duty cycle may be a single value, multiple different values, or values that fall within a range of values forming a solution space.

In various examples herein, control of the aiming pattern is described as performed by the controller 122B. Such control is separate from the methods and processes described above in FIGS. 3-5.

Indeed, any of the controller functions described herein-below may be performed within the same controller or via a separate aiming assembly controller that does not provide the boost functionality above. Controller operations herein, for example, may be performed by multiple laser driving circuits. Further the systems and devices herein may be implemented to include multiple laser driving circuits in the same aiming assembly to allow for use in scanning devices with different internal sensors and monitoring functionality. In some examples, the controller 122B is implemented to include one or both of: a) a circuit to maintain constant laser operating current, with thermal corrections using a stored lookup table as may be useful for aiming assemblies without built-in monitor detectors; and b) a circuit to maintain constant laser monitor current, as may be useful for aiming assemblies with built-in monitor detector.

In some examples, the controller 122B may be configured to control the aiming assembly 122 such that a green laser aiming pattern is generated as a single pulse per frame duration. In some examples, the controller 122B controls the aiming assembly to generate multiple pulses of the green laser aiming pattern per frame duration. The frame duration represents the time it takes the barcode imager to go through an entire image capture interval. For example, the frame duration, Tf, may be the inverse of the frame per second (FPS) rate, F, at which a barcode imager is operated. A 60 FPS barcode imager has a 16.67 ms frame duration, for example.

Moreover, in some examples, the controller 122B determines a duty cycle for the green aiming pattern pulse per frame duration. For example, in some examples, the duty cycle is determined that simultaneously satisfies a frame duration-independent, peak pulse optical power constraint and a frame duration-dependent heat dissipation constraint. In some examples, the duty cycle is determined that simultaneously satisfies a minimum single pulse optical power condition for the aiming pulse and an average power over a train of aiming pulses condition. In some examples, the duty cycle is determined to be within a predetermined tolerance range of an optimization state representing an intersection of a single pulse optical power rule for the aiming pulse and an average power over a train of aiming pulses rule.

FIG. 6 illustrates an example method 600 for driving an aiming assembly of a barcode imager, such as the scanning device 100, to satisfy simultaneous operating constraints. Optionally, the method 600 may include an initial process (block 602) at which the controller (such as the controller 1226) obtains an operating mode of the barcode imager and, at a subsequent process (block 604) obtains static characteristics of an aiming assembly (such as the aiming pattern assembly 122). For example, at the block 602, the controller may determine that the barcode imager is either a trigger-level mode in which a barcode imager captures images in response to the manually actuatable trigger 120, for example, when the barcode imager is in a handheld mode. Or the controller may determine that the barcode imager is in a presentation mode in which the barcode imager captures images over a continuous time period containing a plurality of consecutive frame durations, for example, when the barcode imager is mounted in a fixed position in a presentation mode. In either example, the determination of operating mode may be in response to a user-initiated event, such as pulling of the trigger 120 on a barcode imager, or a sensed stated such as from a sensor in the handle (e.g., elongated handle or lower handgrip portion 116) or base of the barcode imager sensing when the barcode imager is mounted in a stationary base (not shown) for the presentation mode or free from the stationary base for the trigger-level mode.

In some examples, the operating mode is determined, and the simultaneous constraints used to determine a duty cycle may vary with the operating mode. For example, the frame duration of the barcode imager in a trigger-level mode may be different than the frame duration when in the presentation mode.

At the optional block 604, the controller 1226 may determine a static characteristic of the laser aiming assembly, such as characteristics that define operation of the laser source. An example, static characteristic is the laser safety class, e.g., Class 2, Class 3R, Class 3B or Class 4, as determined by The Center for Devices and Radiological Health (CDRH) a part of the Food & Drug Administration and The American National Standards Institute Z136.1 Safe Use of Laser Standard. While any number of static laser characteristics may be used, the class ratings are used in some examples, as they provide a human accessible laser power for visible light condition to be met by the aiming assembly, over the entire field of view and at near field and far field distances to the barcode imager. As noted above, in various examples, the aiming pattern assembly 22 contains illumination components 122A that contain a green laser source, e.g., a green laser diode. In some examples, that green laser source may be a Class 2 laser which is rated to have an output power below 1 mW. In some examples, the controller 122B obtains the static characteristics stored in the memory 204 or stored in the aiming illumination components 22A.

To determine a duty cycle for the pulses generated by the aiming assembly, the controller 122B (block 606) obtains imaging parameters for the barcode imager, which may include the frames per second or frame duration at which the barcode imager operates. Such data may be stored in the memory 204, for example. In some examples, these imaging parameters vary with the operating mode (determined by block 602). For example, the frame duration may be different when the barcode imager is in the trigger-level mode compared to the presentation mode.

At a block 608, the controller 122B identifies constraints that are to be satisfied during operation of the barcode imager. In the illustrated example, two classes of constraints are identified, a frame duration dependent constraint and another constraint that is a frame-duration independent constraint. More specifically, in an example, the first constraint frame-duration dependent peak pulse optical power constraint that establish a peak pulse optical power for one or more green aiming pulses per frame duration. This constraint limits the optical power that can be delivered during a frame duration. The second constraint a frame-duration independent constraint that provides a heat dissipation constraint on the barcode imager, so that a maximum amount of required heat dissipation is not greater than a predetermined agreement.

With the frame-duration dependent and frame-duration independent constraints identified, at a block 610, the controller 122B applies a resolution rule to determine a duty cycle that simultaneously resolves the frame-duration depended peak pulse optical power constraint and the frame-duration independent heat dissipation constraint. At a block 612, the aiming assembly is controlled to operate in accordance with the duty cycle.

In various implementations, the method 600 may start at block 606, for example, where the simultaneous constraints are not dependent upon an operating mode or where the simultaneous constraints are automatically accessed by the controller and not determined based on the operating mode. Further, the static characteristics of the laser aiming assembly may not be obtained, for example, where the simultaneous constraints stored within the barcode imager already incorporate any relevant static characteristics. Other variations to those described include the use of more than two simultaneous constraints.

Figure 7:
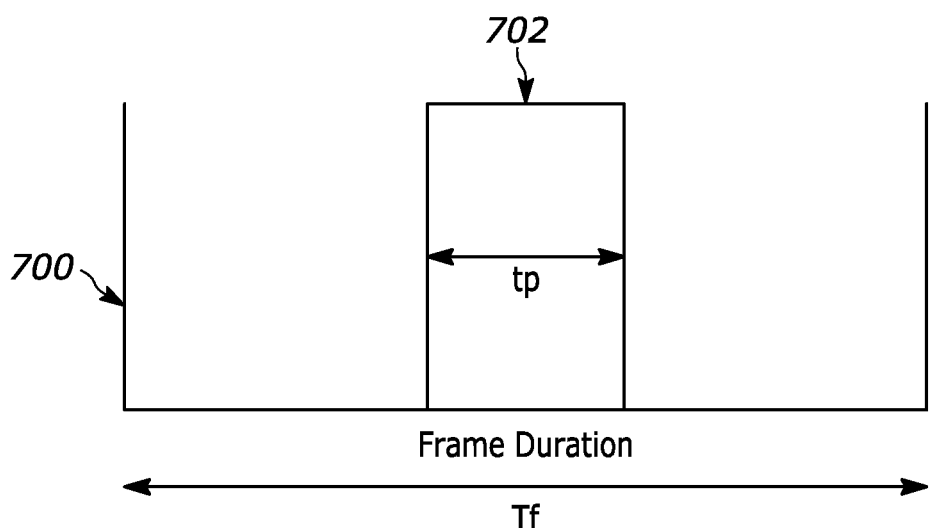
FIG. 7 illustrates a frame duration of a scanning device image sensor showing an aiming pulse with a determined duty cycle, in accordance with various embodiments of the present invention.

In an example implementation of the block 610, the controller 122B optionally determines an operating mode of the barcode imager and based on that operating mode determines the duty cycle for a single aiming pulse per each frame duration, such that the duty cycle over each frame duration simultaneously satisfies a frame duration-independent, peak pulse optical power constraint and a frame duration-dependent heat dissipation constraint. In some examples, the processes of block 610 do not determine or use an operating mode of the barcode imager. In an example, the peak pulse optical power constraint is an accessible emission limit for the aiming pulse, where that constraint applies to the pulse but does not depend upon the frame duration. For example, for a Class 2 green laser source, the accessible emission limit, AEL_pulse, expressed as Watts (W) for the aiming pulse, is expressed as:

$$AEL\_pulse = 7 \times 10^{-4}(tp)^{-0.25} \tag{2}$$

where tp is the pulse duration. FIG. 7 illustrates a frame duration 700, with length of time, D, over which the barcode imager is to capture an image of a field of view, and illustrates a pulse 702 having a pulse duration, tp, for an aiming pulse contained within that frame duration.

Whereas the peak pulse optical power constraint does not depend upon the frame duration, Tf, in an example, the heat dissipation constraint does depend on the frame duration and is an accessible emission limit for an average power of aiming pulses over a time window formed of a plurality of continuous frame durations. That constraint is expressed as, P_ave, expressed in Watts (W):

$$P\_ave = 7 \times 10^{-4}(T1)^{-0.25} \tag{3}$$

where T1 is the time window duration and varies with power rating of the green laser source according to a laser safety class. Thus, the heat dissipation constraint may depend upon the frame duration and, in some examples, a static characteristic of the aiming assembly, such as the laser safety class. For an aiming assembly using a Class 1 laser source, the time window, T1, is taken as 10 s and the P_ave is 0.394 mW. For a Class 2 laser source, T1 is 0.25 s and the P_ave is 0.99 mW.

To determine the duty cycle in an example, the controller 1226 determines a duty cycle that satisfies both constraints in Eq. 2 and Eq. 3. Such a solution may be predetermined and stored in the aiming assembly or the memory 204, for example, as a dedicated DC value for each operating mode, or as a lookup table of DC values determined for different aiming assembly laser safety classifications, different operating frame rates, or other static characteristics and imaging parameters. In some examples, a solution may be stored as a solution space of solution values. In some examples, at the block 610, the controller 1226 may apply an iterative algorithm, simultaneous linear equation resolver, or other techniques to find a solution or solution space to multiple constraint expressions. In an example, at the block 610, the controller 1226 may convert Eq. (2), which is frame-independent, into a function of frame duration and duty cycle, DC. Eq. (2) becomes:

$$P\_ave(Tf,DC) = 7 \times 10^{-4}(Tf \times DC)^{-0.25} \times DC \tag{4}$$

where Tf is the frame duration and P_ave (T f, DC) is a frame-average laser optical power from single pulse. At the block 610, the DC may be determined by finding the simultaneous solution to both the frame-average laser optical power of Eq. 4 and the accessible emission limit for an average power of aiming pulses over a time window formed of a plurality of continuous frame durations from Eq. 3, the result being:

$$7 \times 10^{-4}(Tf \times DC)^{-.25} \times DC = 7 \times 10^{-4}(T1)^{-.25} \tag{5}$$

$$DC = (T1/Tf)^{-\frac{1}{3}} \tag{6}$$

$$DC = \sqrt[3]{(Tf/T1)} \tag{7}$$

which, in an example, results in a DC=0.119 for a Class 1 laser (i.e., T1=10 s) operating at a frame rate, F, 60 fps, and which results in a DC=0.405 for a Class 2 laser (i.e., T1=0.25 s) operating at 60 fps, where F=1/Tf. That is, in some examples, Eqs. 5, 6, and 7 each represent an equivalent expression of the simultaneous constraint solution for the DC of a single aiming pulse within a frame duration. Of course, the time window, T1, may vary as well as the frame durations, Tf, as may the laser safety class or other power ratings of the aiming source. Further still, in various implementations, a simultaneous solution of constraints may be satisfied by any DC values that fall within a solution space of values.

Figure 8:
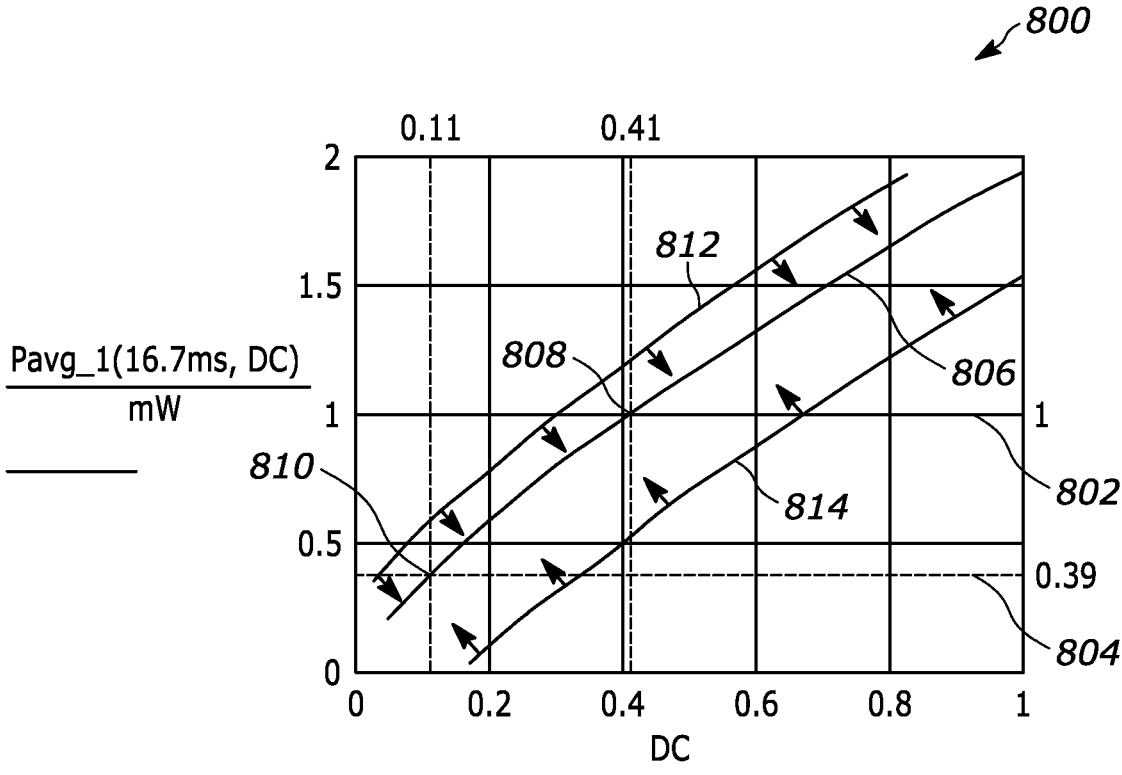
FIG. 8 illustrates an example solution space of suitable duty cycles for an aiming pulse within a frame duration of the scanning device, in accordance with various embodiments of the present invention.

FIG. 8 illustrates an example solution space 800 of suitable duty cycles that may be determined at the block 610. Heat dissipation constraint values for Class 1 and Class 2 laser sources are plotted at 802 and 804, respectively. The peak pulse optical power constraint is plotted at 806. A first intersection point 808 represents a duty cycle, DC, that satisfies simultaneous conditions for a Class 1 laser, resulting in a DC=0.11. A second intersection point 810 represents a DC value that satisfies the conditions for a Class 2 laser, such as a green laser sources in various examples here, resulting in a DC=0.41. Depending on the solution protocol of block 610, the controller 122B may identify the DC value as the specific intersection of the constraints. In other examples, the DC value may be selected over a sufficient range values, for example, when considering other data such as operating mode of the barcode imager, static characteristics of the aiming assembly, and operating temperature. A DC that sits in a space above the peak pulse optical power constraint 806 may result in a laser out too bright for user operation, and not in compliance with desired eye safety standards. A DC that sits in a space below the constraint 806 would satisfy eye safety standards, but for various applications it may result in a sufficiently bright aiming pattern in the field of view. For example, to prevent ambient light from washing out a green laser aiming pattern, the controller 122B may apply a solution protocol that seeks to produce the highest optical power aiming pattern as possible while satisfying the simultaneous conditions. The peak optical power constraint is determined for a peak power region of aiming pattern, which normally would be the central spot of the aiming pattern. In various implementations, the solution protocol applied at the block 610 may mean selecting a DC among a range of values in the solution space. The solution space 800, for example, may be satisfied by DC values that are within +5%, +10%, +15%, or +20% above one or more of the simultaneous constraints. For example, the solution space 800 may include DC values that are within +5%, +10%, +15%, or +20% above any one or more of the constraints 802, 804, and 806. The solution space 800 may be satisfied by DC values that are within −5%, −10%, −20%, −30%, −40%, −50%, −60%, −70%, −80%, −90% below one or more of the simultaneous constraints. For example, the solution space 800 may include DC values that are within −5%, −10%, −20%, −30%, −40%, −50%, −60%, −70%, −80%, −90% below any one or more of the constraints 802, 804, and 806. FIG. 8 illustrates a range of suitable DC values that extend from an upper bound 812 to a lower bound 814, collectively defining the bounds of the solution space 800 in this illustrated example. In an example, the suitable DC values extend from +20% above the constraint 806 to −90% below the constraint 806.

In an example of green laser source having a Class 2 laser safety class, wherein the barcode imager is configured to capture images at 60 frames per second, thus resulting in a frame duration of 16.67 ms, in a trigger-level operating mode, the pulse during, tp, of a single aiming pulse is determined to be between 2 ms (DC=0.12) and 8 ms (DC=0.48). For a presentation operating mode, the tp between 0.5 ms (DC=0.03) and 2 ms (DC=0.12).

With the duty cycle determined at block 610, the controller 122B (block 612) controllers the aiming assembly to generate aiming pulses according to the duty cycle and may optionally synchronize the position of the aiming pulse with a sensor exposure window within the frame duration. The sensor exposure window corresponds to the window over which the image sensor 106 is exposed to capture an image of the field of view of the barcode imager. In some examples, the sensor exposure window is determined by a controller shutter of the image sensor 106.

Figures 9, 10:
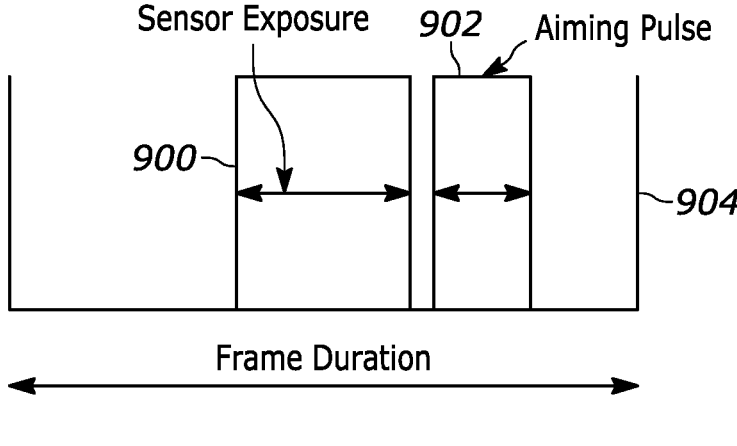
FIGS. 9-11 illustrate different synchronizations, respectively, between an aiming pulse and an image sensor exposure window both within a frame duration, in accordance with various embodiments of the present invention.
Figure 11:
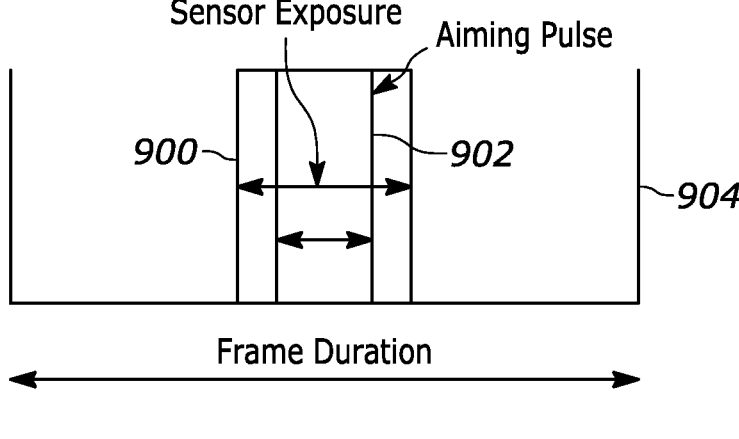

FIGS. 9-11 illustrate various resulting synchronizations between the aiming pulse and the sensor window, within a frame duration. The controller may set the duty cycle of the aiming pulse as having a non-overlapping duty cycle, such that a sensor exposure window 900 and an aiming pulse 902 do not overlap during the frame duration 904 (FIG. 9). In another example, the duty cycle of the aiming pulse is an overlapping duty cycle, such that the sensor exposure window 900 and the aiming pulse 902 at least partially overlap during the frame duration 904 (FIG. 7X). In another example, the duty cycle of the aiming pulse is an overlapping duty cycle where the aiming pulse x602 occurs within the sensor exposure window 900 of the imager during the frame duration 904 (FIG. 8X). For example, in some implementations the pulse width of the aiming pulse is determined to not only satisfy the simultaneous constraints, but also to be equal in width to that of the sensor exposure window or less than the width of the sensor exposure window to ensure complete overlap. In some examples, the duty cycle of the aiming pulse and/or synchronization of the aiming pulse is further determined based on ambient light intensity levels, for example, as measured during a sensor exposure window, to adjust the optical power of the aiming pulse to ensure sufficient brightness against ambient light intensity levels.

The present techniques include other variations. In some examples, the duty cycle of the aiming pulse is determined to satisfy more than two simultaneous constraints. The constraints may include a lifetime degradation condition, an aiming laser source current condition, an aiming laser source voltage condition, a continuous wave optical power condition, a pulse optical power condition, an optimum eye safety value, an average optical power over a train of aiming pulses, ambient light intensity level, and a desired total accumulated aiming laser source lifetime. Example additional constraints include a minimum single pulse optical power condition for the aiming pulse and an average power over a train of aiming pulses condition, that may be simultaneously satisfied. Other additional constraints include a applying a predetermined tolerance range of acceptable values over a solution space, the values corresponding to simultaneously meeting two or more constraints, and then using a further constraint or separate condition to determine the duty cycle and/or synchronization of the aiming pulse. In some examples, the constraints are operating mode dependent. For example, certain constraints to be simultaneously satisfied are used during a trigger-level mode and other constraints are used during a presentation mode.

The above description refers to a block diagram of the accompanying drawings. Alternative implementations of the example represented by the block diagram includes one or more additional or alternative elements, processes and/or devices. Additionally, or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components represented by the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions. The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may com- bined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A method for driving a laser diode, the method comprising:

outputting, by a boost regulator, a maximum boost voltage to drive a laser diode, wherein the laser diode is configured to output light within a wavelength range of 495 nanometers (nm) to 570 nm;

measuring, by a boost servo, a laser voltage of the laser diode;

calculating, by the boost servo, a voltage difference between the laser voltage and the maximum boost voltage;

comparing, by the boost servo, the voltage difference to a drive voltage corresponding to a laser drive circuit to determine whether or not the voltage difference exceeds the drive voltage;

responsive to determining that the voltage difference exceeds the drive voltage by an excess voltage, causing, by the boost servo, the boost regulator to output an optimum voltage based on the excess voltage;

calculating, by the boost servo, a low voltage configured to drive at least one additional component that is electrically coupled to the boost regulator when the laser diode is inactive; and responsive to the laser diode being inactive, causing, by the boost servo, the boost regulator to output the low voltage to power the at least one additional component.

2. The method of claim 1, wherein the wavelength range is 510 nm to 525 nm.

3. The method of claim 1, wherein the at least one additional component is an illumination light emitting diode (LED) or a drive circuit.

4. The method of claim 1, wherein the laser voltage is a first laser voltage, the optimum voltage is a first optimum voltage, the voltage difference is a first voltage difference, the excess voltage is a first excess voltage, and the method further comprises:

measuring, by the boost servo, a second laser voltage of the laser diode and a first optimum boost voltage;

calculating, by the boost servo, a second voltage difference between the second laser voltage and the first optimum boost voltage;

comparing, by the boost servo, the second voltage difference to the drive voltage to determine whether or not the second voltage difference exceeds the drive voltage; and responsive to determining that the second voltage difference exceeds the drive voltage by a second excess voltage, causing, by the boost servo, the boost regulator to output a second optimum voltage based on the second excess voltage.

5. The method of claim 1, further comprising:

measuring, by the boost servo, a laser current sense voltage; and calculating, by the boost servo, the voltage difference by subtracting the laser voltage and the laser current sense voltage from the maximum boost voltage.

6. The method of claim 1, further comprising:

determining, by the boost servo, whether or not the laser diode has been inactive for greater than a timeout interval;

responsive to determining that the laser diode has been inactive for less than the timeout interval, causing, by the boost servo, the boost regulator to output the optimum voltage to drive the laser diode; and responsive to determining that the laser diode has been inactive for greater than the timeout interval, causing, by the boost servo, the boost regulator to output the maximum boost voltage to drive the laser diode.

7. The method of claim 1, further comprising:

determining, by the boost servo, that the laser diode has been active for greater than an activity duration threshold;

responsive to determining that the laser diode has been active for greater than the activity duration threshold, measuring, by the boost servo, the laser voltage at an anode of the laser diode; and calculating, by the boost servo, the voltage difference between the laser voltage at the anode of the laser diode and the optimum voltage.

8. The method of claim 1, further comprising:

obtaining, by the boost servo, a laser temperature using a temperature sensor;

obtaining, by the boost servo, a lookup optimum voltage from a temperature reference table based on the laser temperature; and comparing, by the boost servo, the optimum voltage to the lookup optimum voltage to determine a change to the optimum voltage.

9. An imaging engine utilizing a laser diode, the imaging engine comprising:

an imaging assembly;

an image processing assembly for decoding indicia; and an aiming pattern assembly that includes a laser drive subassembly comprising:

a laser diode configured to output light within a wavelength range of 495 nanometers (nm) to 570 nm, a boost regulator configured to output a maximum boost voltage to drive the laser diode, and

32 a boost servo, configured to be electrically coupled with the laser diode and the boost regulator, wherein the boost servo is further configured to:

measure a laser voltage of the laser diode, calculate a voltage difference between the laser voltage and the maximum boost voltage, compare the voltage difference to a drive voltage corresponding to a laser drive circuit to determine whether or not the voltage difference exceeds the drive voltage, responsive to determining that the voltage difference exceeds the drive voltage by an excess voltage, cause the boost regulator to output an optimum voltage based on the excess voltage, calculate a low voltage configured to drive at least one additional component that is electrically coupled to the boost regulator when the laser diode is inactive, and responsive to the laser diode being inactive, cause the boost regulator to output the low voltage to power the at least one additional component.

10. The imaging engine of claim 9, wherein the at least one additional component is an illumination light emitting diode (LED) or a drive circuit.

11. The imaging engine of claim 9, wherein the laser voltage is a first laser voltage, the optimum voltage is a first optimum voltage, the voltage difference is a first voltage difference, the excess voltage is a first excess voltage, and the boost servo is further configured to:

measure a second laser voltage of the laser diode and a first optimum boost voltage;

calculate a second voltage difference between the second laser voltage and the first optimum boost voltage;

compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

12. The imaging engine of claim 9, wherein the laser drive subassembly further comprises a laser current sense module, and wherein the boost servo is further configured to:

measure a laser current sense voltage across the laser current sense module; and calculate the voltage difference by subtracting the laser voltage and the laser current sense voltage from the maximum boost voltage.

13. The imaging engine of claim 9, wherein the boost servo is further configured to:

determine whether or not the laser diode has been inactive for greater than a timeout interval;

responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

14. The imaging engine of claim 9, wherein the laser drive subassembly further comprises a temperature sensor configured to measure a laser temperature, and a temperature reference table including lookup optimum voltages, and wherein the boost servo is further configured to:

obtain the laser temperature using the temperature sensor;

obtain a respective lookup optimum voltage from the temperature reference table based on the laser temperature; and compare the optimum voltage to the respective lookup optimum voltage to determine a change to the optimum voltage.

15. The imaging engine of claim 9, wherein the boost servo is further configured to:

determine that the laser diode has been active for greater than an activity duration threshold;

responsive to determining that the laser diode has been active for greater than the activity duration threshold, measure the laser voltage at an anode of the laser diode; and calculate the voltage difference between the laser voltage at the anode of the laser diode and the optimum voltage.

16. A tangible machine-readable medium comprising instructions that, when executed, cause a machine to at least:

measure a laser voltage of a laser diode, wherein the laser diode is configured to output light within a wavelength range of 495 nanometers (nm) to 570 nm;

calculate a voltage difference between the laser voltage and a maximum boost voltage supplied to drive the laser diode;

compare the voltage difference to a drive voltage corresponding to a laser drive circuit to determine whether or not the voltage difference exceeds the drive voltage;

responsive to determining that the voltage difference exceeds the drive voltage by an excess voltage, cause a boost regulator to output an optimum voltage based on the excess voltage;

calculate a low voltage configured to drive at least one additional component that is electrically coupled to the boost regulator when the laser diode is inactive; and responsive to the laser diode being inactive, cause the boost regulator to output the low voltage to power the at least one additional component.

17. The tangible machine-readable medium of claim 16, wherein the at least one additional component is an illumination light emitting diode (LED) or a drive circuit.

18. The tangible machine-readable medium of claim 16, wherein the laser voltage is a first laser voltage, the optimum voltage is a first optimum voltage, the voltage difference is a first voltage difference, the excess voltage is a first excess voltage, and the instructions, when executed, further cause the machine to at least:

measure a second laser voltage of the laser diode and a first optimum boost voltage;

calculate a second voltage difference between the second laser voltage and the first optimum boost voltage;

compare the second voltage difference to the drive voltage to determine whether or not the second voltage difference exceeds the drive voltage; and responsive to determining that the second voltage difference exceeds the drive voltage by a second excess voltage, cause the boost regulator to output a second optimum voltage based on the second excess voltage.

19. The tangible machine-readable medium of claim 16, wherein the instructions, when executed, further cause the machine to at least:

measure a laser current sense voltage across a laser current sense module; and calculate the voltage difference by subtracting the laser voltage and the laser current sense voltage from the maximum boost voltage.

20. The tangible machine-readable medium of claim 16, wherein the instructions, when executed, further cause the machine to at least:

determine whether or not the laser diode has been inactive for greater than a timeout interval;

responsive to determining that the laser diode has been inactive for less than the timeout interval, cause the boost regulator to output the optimum voltage to drive the laser diode; and responsive to determining that the laser diode has been inactive for greater than the timeout interval, cause the boost regulator to output the maximum boost voltage to drive the laser diode.

* * * * *